(12) United States Patent
Noro

(10) Patent No.: US 8,217,933 B2
(45) Date of Patent: Jul. 10, 2012

(54) METHOD AND APPARATUS FOR DETECTING BETWEEN VIRTUAL OBJECTS

(75) Inventor: Hideo Noro, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 793 days.

(21) Appl. No.: 12/132,940

(22) Filed: Jun. 4, 2008

(65) Prior Publication Data

US 2008/0303815 A1    Dec. 11, 2008

(30) Foreign Application Priority Data

Jun. 11, 2007   (JP) ................................. 2007-154436

(51) Int. Cl.
*G06T 15/00* (2011.01)
*G09G 5/00* (2006.01)

(52) U.S. Cl. ......... 345/419; 345/619; 345/949; 345/958
(58) Field of Classification Search .................... 345/420
See application file for complete search history.

(56) References Cited

U.S. PATENT DOCUMENTS

| | | | |
|---|---|---|---|
| 6,518,966 B1 * | 2/2003 | Nakagawa | 345/422 |
| 2007/0237038 A1 * | 10/2007 | Li et al. | 369/13.35 |

FOREIGN PATENT DOCUMENTS

| | | |
|---|---|---|
| JP | 11-328445 | 11/1999 |
| JP | 2006-092222 A | 4/2006 |
| JP | 2006-302035 A | 11/2006 |

OTHER PUBLICATIONS

Naga K. Govindaraju, Ming C. Lin, and Dinesh Manocha. 2004. Fast and reliable collision culling using graphics hardware. In Proceedings of the ACM symposium on Virtual reality software and technology (VRST '04). ACM, New York, NY, USA, 2-9.*
Naga K. Govindaraju et al. CULLIDE: interactive collision detection between complex models in large environments using graphics hardware. In Proceedings of the ACM SIGGRAPH/EUROGRAPHICS conference on Graphics hardware (HWWS '03). Eurographics Association, Aire-la-Ville, Switzerland, Switzerland, 25-32.*
Alfred Aho, John Hoperoft, and Jeffrey Ullman, Data Structures and Algorithms (reprinted with corrections Apr. 1987), pp. 42-44 and 61-63.*
The above references were cited in a Nov. 21, 2011 Japanese Office Action, which is enclosed without an English Translation, that issued in Japanese Patent Application No. 2007-154436.

* cited by examiner

*Primary Examiner* — Kee M Tung
*Assistant Examiner* — Zhengxi Liu
(74) *Attorney, Agent, or Firm* — Cowan, Liebowitz & Latman, P.C.

(57) ABSTRACT

A collision target map and a collision target LUT are generated for each pixel to be subjected to rendering as collision target information with recorded identification information for CG data rendering on the pixel, while carrying out rendering of colliding object group CG data. Then, collision target information corresponding to a rendering pixel is referenced while carrying out rendering of collided object group CG data. In a case in which the colliding object group CG data is contained in the collision target information, it is determined that collision detection should be carried out for a virtual object being rendered, and collision detection information is generated. Such collision detection information allows collision between virtual objects to be detected at high speed.

12 Claims, 17 Drawing Sheets

F I G. 3
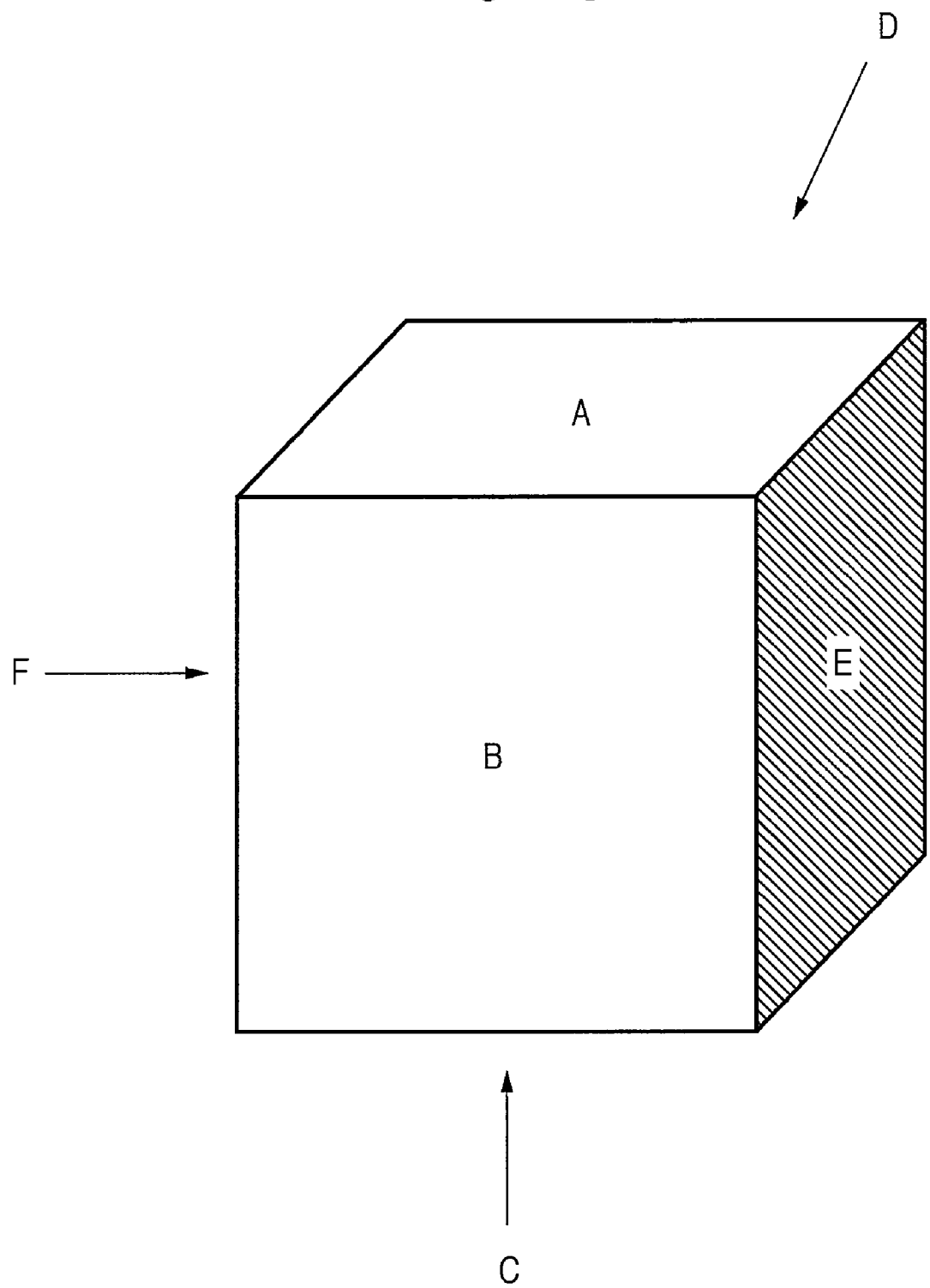

FIG. 14A

| PIXEL NUMBER | IDENTIFICATION INFORMATION | NUMBER OF PIXELS | FOLLOWING PIXEL NUMBER |
|---|---|---|---|
| 0 | | 192 | 1 |
| 1 | A | 1 | |

AFTER RENDERING OF POLYGON A (PIXEL (9, 4))

FIG. 14B

| PIXEL NUMBER | IDENTIFICATION INFORMATION | NUMBER OF PIXELS | FOLLOWING PIXEL NUMBER |
|---|---|---|---|
| 0 | | 165 | 1 |
| 1 | A | 27 | |

AFTER RENDERING OF POLYGON A (ALL PIXELS)

FIG. 15A

| PIXEL NUMBER | IDENTIFICATION INFORMATION | NUMBER OF PIXELS | FOLLOWING PIXEL NUMBER |
|---|---|---|---|
| 0 | | 164 | 2 |
| 1 | A | 27 | |
| 2 | B | 1 | |

AFTER RENDERING OF POLYGON B (PIXEL (7, 7))

FIG. 15B

| PIXEL NUMBER | IDENTIFICATION INFORMATION | NUMBER OF PIXELS | FOLLOWING PIXEL NUMBER |
|---|---|---|---|
| 0 | | 105 | 2 |
| 1 | A | 27 | |
| 2 | B | 60 | |

AFTER RENDERING OF POLYGON B (ALL PIXELS)

FIG. 16A

| PIXEL NUMBER | IDENTIFICATION INFORMATION | NUMBER OF PIXELS | FOLLOWING PIXEL NUMBER |
|---|---|---|---|
| 0 | | 105 | |
| 1 | A | 26 | 3 |
| 2 | B | 60 | |
| 3 | A, D | 1 | |

AFTER RENDERING OF POLYGON D (PIXEL (10, 4))

FIG. 16B

| PIXEL NUMBER | IDENTIFICATION INFORMATION | NUMBER OF PIXELS | FOLLOWING PIXEL NUMBER |
|---|---|---|---|
| 0 | | 105 | |
| 1 | A | 6 | 3 |
| 2 | B | 18 | 4 |
| 3 | A, D | 21 | |
| 4 | B, D | 42 | |

AFTER RENDERING OF POLYGON D (ALL PIXELS)

FIG. 17

| PIXEL NUMBER | IDENTIFICATION INFORMATION | NUMBER OF PIXELS | FOLLOWING PIXEL NUMBER |
|---|---|---|---|
| 0 | | 105 | |
| 1 | A | 6 | |
| 2 | B | 18 | |
| 3 | A, D | 20 | 5 |
| 4 | B, D | 36 | 6 |
| 5 | A, D, E | 1 | |
| 6 | B, D, E | 6 | |

AFTER RENDERING OF POLYGON E (ALL PIXELS)

F I G. 18A

| PIXEL NUMBER | IDENTIFICATION INFORMATION | NUMBER OF PIXELS | FOLLOWING PIXEL NUMBER |
|---|---|---|---|
| 0 |  | 105 |  |
| 1 | A | 5 | 7 |
| 2 | B | 18 |  |
| 3 | A, D | 20 |  |
| 4 | B, D | 36 |  |
| 5 | A, D, E | 1 |  |
| 6 | B, D, E | 6 |  |
| 7 | A, F | 1 |  |

AFTER RENDERING OF POLYGON F (PIXEL (9, 4))

F I G. 18B

| PIXEL NUMBER | IDENTIFICATION INFORMATION | NUMBER OF PIXELS | FOLLOWING PIXEL NUMBER |
|---|---|---|---|
| 0 |  | 105 |  |
| 1 | A | 0 | 7 |
| 2 | B | 18 |  |
| 3 | A, D | 18 | 8 |
| 4 | B, D | 36 |  |
| 5 | A, D, E | 1 |  |
| 6 | B, D, E | 6 |  |
| 7 | A, F | 6 |  |
| 8 | A, D, F | 2 |  |

AFTER RENDERING OF POLYGON F (PIXEL (9, 6))

F I G. 19A

| PIXEL NUMBER | IDENTIFICATION INFORMATION | NUMBER OF PIXELS | FOLLOWING PIXEL NUMBER |
|---|---|---|---|
| 0 |  | 105 |  |
| 1 | B, F | 1 |  |
| 2 | B | 17 | 1 |
| 3 | A, D | 17 | 8 |
| 4 | B, D | 36 |  |
| 5 | A, D, E | 1 |  |
| 6 | B, D, E | 6 |  |
| 7 | A, F | 6 |  |
| 8 | A, D, F | 3 |  |

AFTER RENDERING OF POLYGON F (PIXEL (7, 7))

F I G. 19B

| PIXEL NUMBER | IDENTIFICATION INFORMATION | NUMBER OF PIXELS | FOLLOWING PIXEL NUMBER |
|---|---|---|---|
| 0 |  | 105 |  |
| 1 | B, F | 18 |  |
| 2 | B | 0 | 1 |
| 3 | A, D | 17 | 8 |
| 4 | B, D | 30 | 9 |
| 5 | A, D, E | 1 |  |
| 6 | B, D, E | 6 |  |
| 7 | A, F | 6 |  |
| 8 | A, D, F | 3 |  |
| 9 | B, D, F | 6 |  |

AFTER RENDERING OF POLYGON F (ALL PIXELS)

FIG. 21

| PIXEL NUMBER | IDENTIFICATION INFORMATION | PROCESSED FLAG |
|---|---|---|
| 0 | | UNPROCESSED |
| 1 | B, F | UNPROCESSED |
| 2 | B | UNPROCESSED |
| 3 | A, D | UNPROCESSED |
| 4 | B, D | UNPROCESSED |
| 5 | A, D, E | UNPROCESSED |
| 6 | B, D, E | UNPROCESSED |
| 7 | A, F | UNPROCESSED |
| 8 | A, D, F | UNPROCESSED |
| 9 | B, D, F | UNPROCESSED |

START TIME

| PIXEL NUMBER | IDENTIFICATION INFORMATION | PROCESSED FLAG |
|---|---|---|
| 0 | | PROCESSED |
| 1 | B, F | UNPROCESSED |
| 2 | B | UNPROCESSED |
| 3 | A, D | UNPROCESSED |
| 4 | B, D | UNPROCESSED |
| 5 | A, D, E | UNPROCESSED |
| 6 | B, D, E | UNPROCESSED |
| 7 | A, F | UNPROCESSED |
| 8 | A, D, F | UNPROCESSED |
| 9 | B, D, F | UNPROCESSED |

AFTER RENDERING OF POLYGON X (PIXEL (4, 4))

| PIXEL NUMBER | IDENTIFICATION INFORMATION | PROCESSED FLAG |
|---|---|---|
| 0 | | PROCESSED |
| 1 | B, F | UNPROCESSED |
| 2 | B | UNPROCESSED |
| 3 | A, D | UNPROCESSED |
| 4 | B, D | UNPROCESSED |
| 5 | A, D, E | UNPROCESSED |
| 6 | B, D, E | UNPROCESSED |
| 7 | A, F | PROCESSED |
| 8 | A, D, F | UNPROCESSED |
| 9 | B, D, F | UNPROCESSED |

AFTER RENDERING OF POLYGON X (PIXEL (7, 6))

| PIXEL NUMBER | IDENTIFICATION INFORMATION | PROCESSED FLAG |
|---|---|---|
| 0 | | PROCESSED |
| 1 | B, F | PROCESSED |
| 2 | B | UNPROCESSED |
| 3 | A, D | UNPROCESSED |
| 4 | B, D | UNPROCESSED |
| 5 | A, D, E | UNPROCESSED |
| 6 | B, D, E | UNPROCESSED |
| 7 | A, F | PROCESSED |
| 8 | A, D, F | UNPROCESSED |
| 9 | B, D, F | UNPROCESSED |

AFTER RENDERING OF POLYGON X (PIXEL (7, 7))

METHOD AND APPARATUS FOR DETECTING BETWEEN VIRTUAL OBJECTS

BACKGROUND OF THE INVENTION

1. Field of the Invention

The present invention relates to a method and an apparatus for detecting collision between a plurality of virtual objects in a virtual space.

2. Description of the Related Art

Three-dimensional (3D) computer graphics (CG) technology has been used with the development thereof in various fields, and recently, has also been actively used in the fields of VR (Virtual Reality) and MR (Mixed Reality) as well as 3D-CAD (Computer-Aided Design).

In some applications of these fields, it is necessary to not only three-dimensionally represent virtual objects by CG but also consider collision of virtual objects with each other.

For example, in design using 3D-CAD, when a component represented as a virtual object collides with another component (multiple components occupy the same space), actual production is not possible. Therefore, during design it is checked if components collide with each other. Specifically, a method is used in which collisions are checked all at once with a specific component layout, and this method is referred to as static collision check. In addition, in the case of an apparatus with a movable portion, there is also a method in which collisions with other components are checked while running a mechanical simulation on the movable portion, and this method is referred to as dynamic collision check.

In the case of the dynamic collision check, the position and orientation which can be taken by the movable component is limited. Therefore, it is possible to take time for computing collisions, save the results as historical information, and represent the results to a user after the completion of total computation. The same applies to the static collision check described above.

In a design application using 3D-CAD, objects to be checked if there are collisions or not (hereinafter, referred to as target objects) are components of an apparatus, and it is usually the case that the possible position and orientation of the target objects are fixed, or sufficiently limited even for the target objects are movable. Therefore, it is also possible to carry out collision check exhaustively for the position and orientation which can be taken by the target objects.

However, in a VR or MR application, one of target objects can take many more positions and orientations, such as, for example, a tool held and operated in a user's hand or the user's hand itself, as compared with components as target objects in 3D-CAD.

For example, in the case of a VR or MR application for the purpose of manufacturing training for a product, collisions of a tool held in a user's hand with objects to be assembled such as components may be checked to feed back the results to the user, in order to give the user a sense of the actual assembly work.

In this case, the positions and orientations which can be taken by the tool held in the user's hand have six degrees of freedom in total, three degrees of freedom for parallel translation components and three degrees of freedom for rotational components, and thus are not substantially limited in the virtual space. Therefore, it is impossible to carry out a collision check in advance for all of the positions and orientations which can be taken by the target objects.

Accordingly, on a case-by-case basis, it is necessary to carry out a collision check in real time, based on the positions and orientations of the target objects.

Since the computations involved in collision checking (collision computation) represent a very high computation load, approaches have been proposed for carrying out such computations in real time. One of the most commonly used approaches is that "collision calculation is not carried out for objects which definitely do not collide with each other". This approach is highly effective for collision computation in real time because unnecessary computation is not carried out.

As an example of this approach, a technique called Sweep and Prune (SAP) is well known. This SAP is a technique in which combinations of virtual objects for which bounding boxes definitely do not overlap are excluded from consideration as candidates for collision computation when a plurality of virtual objects (CG objects) are arranged in world coordinates.

When it is assumed that the world coordinates are represented in an XYZ orthogonal coordinate system, virtual objects for which projections of bounding boxes onto the X axis definitely do not overlap are free from the possibility of colliding with each other, and thus excluded as candidates for collision computation. Next, a similar check is carried out for projections onto the Y axis and projections onto the Z axis. Only combinations of virtual objects for which overlaps of bounding boxes are confirmed on all of the axes are subjected to collision calculation.

However, the bounding boxes are boxes surrounding the actual virtual objects, and thus larger than the actual virtual objects. Therefore, in SAP, in which whether or not collision computation is necessary is determined based on whether or not there is a collision between the bounding boxes, it is often the case that collision computation for combinations of virtual objects which do not actually collide with each other is not completely excluded.

In addition to such an approach for reducing objects to be subjected to collision computation, approaches for speeding up collision computation itself have been also proposed. In many of the approaches for speeding up computation, it is assumed that the target objects are convexity objects. The reason why collision computation is carried out at high speed for convexity objects is not directly related to the present invention, and a detailed description thereof will be thus omitted. It is to be noted that since there are actually virtual objects of concavity objects, relatively heavy preprocessing for decomposing target objects into convexity objects is required in order to use a collision computation approach using this approach for speeding up collision computation.

As described above, in the approach for speeding up collision computation with the assumption that target objects are convexity objects, relatively heavy preprocessing for the target objects into the convexity objects is required. Further, the amount of data after the reprocessing is comparable to the amount of data before the reprocessing. Thus, when this data amount becomes a problem, special measures are required for holding the data.

In addition, Japanese Patent Laid-Open No. 11-328445 describes a method for carrying out collision computation under the condition that collision calculation is carried out within ultimate rendering on an image plane. In this approach, collision computation can be carried out during rendering of virtual objects, and high-speed computation is thus enabled by carrying out computation in a GPU (Graphics Processing Unit). However, the approach described in Japanese Patent Laid-Open No. 11-328445 is not capable of widely application because collision detection is carried out by a collision detection means for each pixel by holding an arrangement of depths of objects for each pixel of a projection image and using a list of depths of overlapped pixels in the projection image. Therefore, it is difficult to apply this approach to collision detection for an ordinary group of virtual objects.

SUMMARY OF THE INVENTION

The present invention has been made in view of the problems of the conventional art described above, and provides, as an aspect thereof, a method and an apparatus for detecting collision between virtual objects at high speed.

According to one aspect of the present invention, there is provided a method for collision detection between virtual objects, comprising: a mapping step of two-dimensionally mapping a position of each polygon of a first virtual object in a predetermined rendering region; a generation step of generating identification information for identifying a polygon mapped in each position of the rendering region, based on information relating to the position of each polygon of the first virtual object mapped in the mapping step; an extraction step of extracting a position at which a second virtual object is rendered in the rendering region; a determination step of selecting, from identification information generated in the generation step, identification information corresponding to a position of a polygon of the second virtual object extracted in the extraction step, and determining a polygon of the first virtual object corresponding to the selected identification information; and a detection step of detecting that the polygon determined in the determination step collides with the polygon of the second virtual object.

According to another aspect of the present invention, there is provided A computer-readable storage medium that stores a program for executing a method for collision detection between virtual objects, the method for collision detection between virtual objects comprising: a mapping step of two-dimensionally mapping a position of each polygon of a first virtual object in a predetermined rendering region; a generation step of generating identification information for identifying a polygon mapped in each position of the rendering region, based on information relating to the position of each polygon of the first virtual object mapped in the mapping step; an extraction step of extracting a position at which a second virtual object is rendered in the rendering region; a determination step of selecting, from the identification information generated in the generation step, identification information corresponding to the position of a polygon of the second virtual object extracted in the extraction step, and determining a polygon of the first virtual object corresponding to the selected identification information; and a detection step of detecting that the polygon determined in the determination step collides with the polygon of the second virtual object.

According to further aspect of the present invention, there is provided a detection apparatus for detecting collision between virtual objects, comprising: a mapping unit for two-dimensionally mapping a position of each polygon of a first virtual object in a rendering region specified in advance; a generation unit for generating identification information for identifying a polygon mapped in each position of the rendering region, based on information relating to the position of each polygon of the first virtual object mapped by the mapping unit; an extraction unit for extracting a position at which a second virtual object is rendered in the rendering region; a determination unit for selecting, from identification information generated by the generation unit, identification information corresponding to a position of a polygon of the second virtual object extracted by the extraction unit, and determining a polygon of the first virtual object corresponding to the selected identification information; and a detection unit for detecting that the polygon determined by the determination unit collides with the polygon of the second virtual object.

Further features of the present invention will become apparent from the following description of exemplary embodiments with reference to the attached drawings.

BRIEF DESCRIPTION OF THE DRAWINGS

FIG. 3 is a diagram illustrating a cube as an example of virtual objects representing colliding object group CG data;

FIGS. 14A and 14B are diagrams for schematically illustrating the content of the collision target LUT 156 in the second embodiment of the present invention;

FIGS. 15A and 15B are diagrams for schematically illustrating the content of the collision target LUT 156 in the second embodiment of the present invention;

FIGS. 16A and 16B are diagrams for schematically illustrating the content of the collision target LUT 156 in the second embodiment of the present invention;

FIG. 17 is a diagram for schematically illustrating the content of the collision target LUT 156 in the second embodiment of the present invention;

FIGS. 18A and 18B are diagrams for schematically illustrating the content of the collision target LUT 156 in the second embodiment of the present invention;

FIGS. 19A and 19B are diagrams schematically illustrating the content of the collision target LUT 156 in the second embodiment of the present invention;

FIG. 21 is a diagram illustrating a configuration example of a collision target LUT in a third embodiment of the present invention and update processing of a collision detection table in the present embodiment.

DESCRIPTION OF THE EMBODIMENTS

Preferred embodiments of the present invention will now be described in detail in accordance with the accompanying drawings.

First Embodiment

Figure 1:
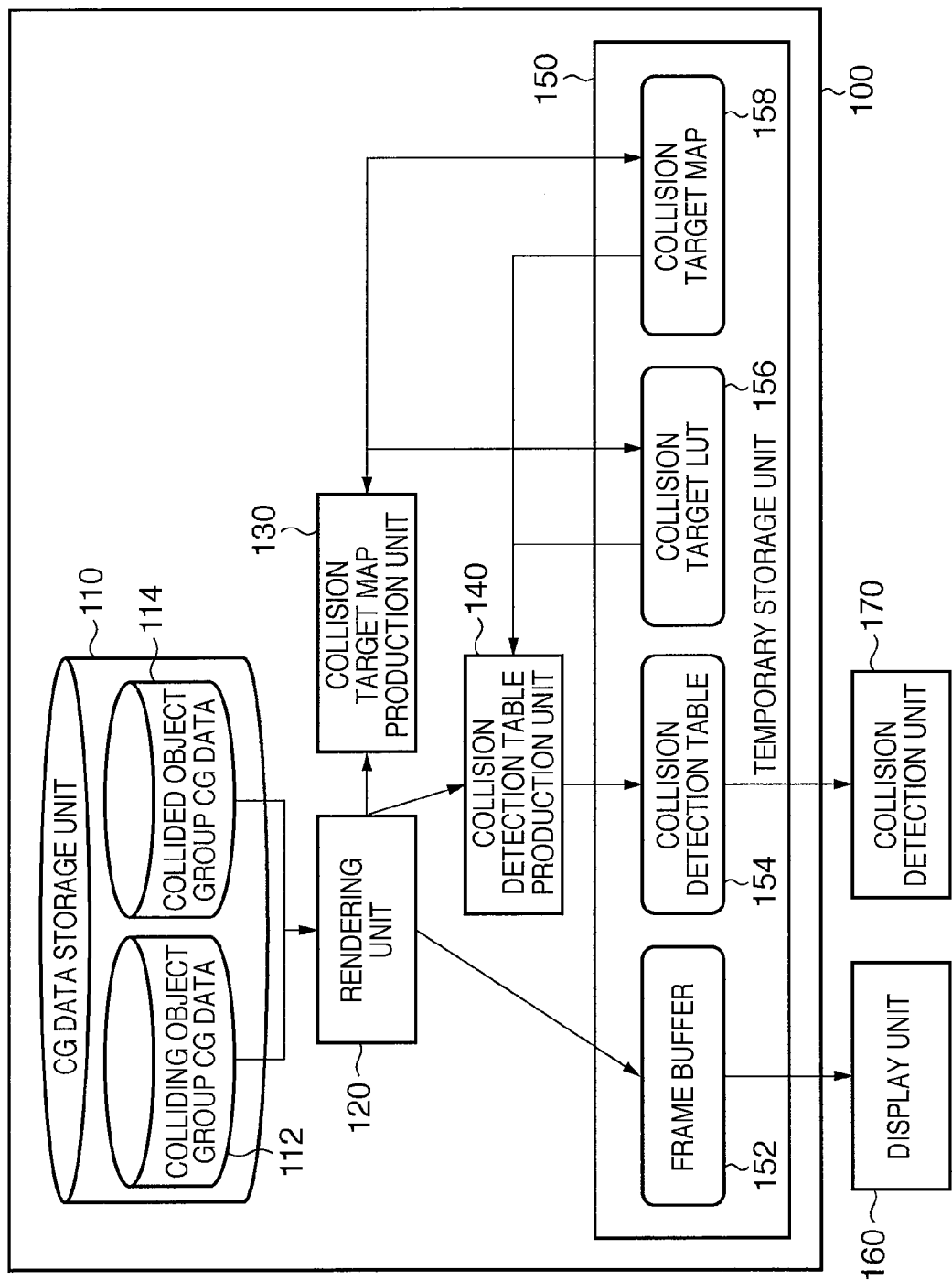
FIG. 1 is a block diagram illustrating a functional configuration example of an apparatus for generating collision detection information according to a first embodiment of the present invention.

FIG. 1 is a block diagram illustrating a functional configuration example of an apparatus for generating collision detection information according to a first embodiment of the present invention, where the collision detection information refers to information for identifying, from among a plurality of virtual objects, a combination of virtual objects to be subjected to collision detection.

An apparatus 100 for generating collision detection information according to the present embodiment divides virtual objects existing in a virtual space (including a mixed reality space) into a colliding object group (which may be even one virtual object) that is a first group and a collided object group (which also may be even one virtual object) that is a second group, and then generates collision detection information for carrying out collision detection between the virtual objects which belong to these two groups.

CG data on the virtual objects contained in the colliding object group and CG data on the virtual objects contained in the collided object group are held in a CG data storage unit 110 as colliding object group CG data 112 and collided object group CG data 114, respectively. The CG data storage unit 110 may be, for example, a storage device such as a RAM in which CG data read from a hard disk drive is stored.

These two types of CG data 112 and 114 contain sufficient data to ultimately render the virtual objects by CG. In the apparatus 100 for generating collision detection information according to the present embodiment, the rendering approach used by a rendering unit 120 to be described below is not limited, but it is assumed that the rendering approach is, for example, an approach using a polygon as an example of the rendering unit. In this case, the colliding object group CG data 112 (the collided object group CG data 114 as well) is composed of a plurality of pieces of collision target CG data. Each piece of collision target CG data is composed of one or more polygons. Each polygon (polygon data) contains data for identifying at least three vertices, material information, and the like. Further, each polygon data is associated, for each polygon, with identification information for identifying the collision target CG data in which the polygon data is contained, which is used by a collision detection unit 170 to be described later. The vertex data here refers to coordinate values for specifying the three-dimensional position of the vertex.

The rendering unit 120 renders, on a frame buffer 152, ultimate rendering images based on the CG data 112 and 114. In general, the rendering unit 120 computes, from the polygon data, the position of a pixel to be subjected to rendering on the frame buffer, and then computes the color of the pixel. Then, the rendering unit 120 updates the pixel in the computed position on the frame buffer with a value corresponding to the computed color. This processing is carried out for all of the pixels on the frame buffer which correspond to the polygon represented by the polygon data, thereby completing rendering of the polygon. This polygon rendering is carried out for all of the polygon data, thereby completing rendering of a whole scene.

It is to be noted that processing such as hidden-surface processing or alpha blending is not directly related to the present invention, and a description thereof will be thus omitted here. What is important is to sequentially compute, for each polygon, the positions on the frame buffer for all of the pixels to be subjected to rendering.

The rendering unit 120 in the present embodiment notifies a collision target map production unit 130 or a collision detection table production unit 140 of the positions on the frame buffer for the pixels to be subjected rendering in addition to the above-described processing carried out by a common rendering unit. This operation will be described with reference to FIG. 2.

Figure 2:
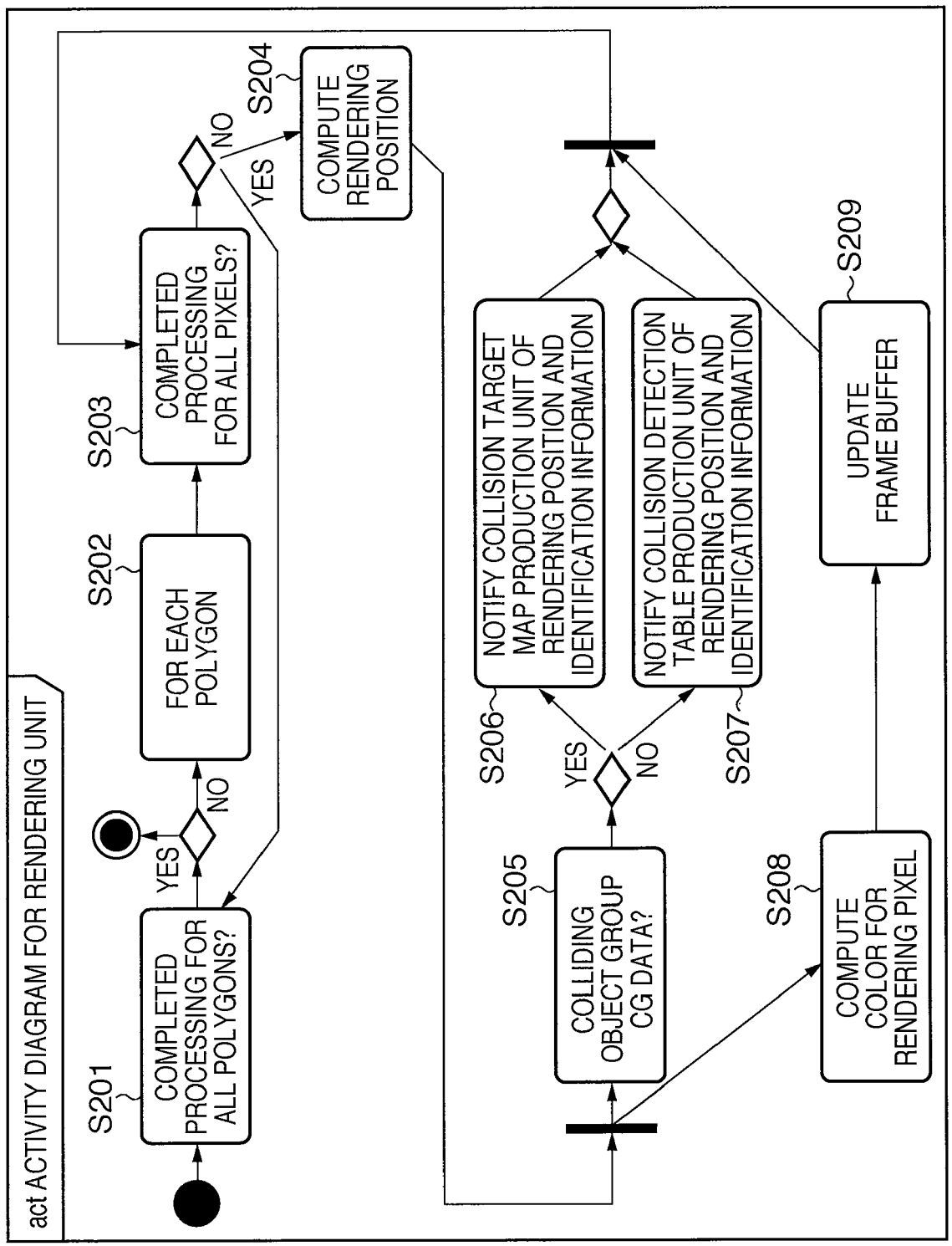
FIG. 2 is a diagram illustrating operation carried out by a rendering unit 120 in the first embodiment of the present invention.

The rendering unit 120 processes the colliding object group CG data 112 and then processes the collided object group CG data 114. FIG. 2 is a diagram illustrating a procedure carried out by the rendering unit 120 for processing each of the CG data 112 and 114.

The apparatus 100 for generating collision detection information according to the present embodiment can be implemented by, for example, a general-purpose computer device, in which case the CG data storage unit 110 can be implemented by a nonvolatile storage device such as a hard disk whereas a temporary storage unit 150 can be implemented by, for example, a RAM. In addition, the rendering unit 120, the collision target map production unit 130, and the collision detection table production unit 140 can be implemented as software by a CPU executing a program stored in a nonvolatile storage device such as a ROM, a hard disk, or a semiconductor memory. Of course, it is also possible to speed up the processing by using hardware such as a GPU for the operation carried out by the rendering unit 120.

First, the procedure for processing the colliding object group CG data 112 will be described.

All of the polygon data contained in the colliding object group CG data 112 is subjected to the following processing. The completion of processing of all the polygons (S201) means that processing of the colliding object group CG data is completed, and processing of the collided object group CG data will be then carried out.

The procedure from S202 carries out processing of each of the unprocessed polygons.

In S203, it is determined whether processing of all of the pixels to be subjected to rendering is completed or not, based on the polygon data undergoing processing. If processing of all of the pixels to be subjected to rendering is completed, processing of the polygon undergoing processing is terminated, and processing of the next unprocessed polygon is carried out.

If there are any unprocessed pixels, the positions on the frame buffer for the pixels to be subjected to rendering are computed (S204). This computation goes through processing in the viewing pipeline for carrying out a series of coordinate transformations such as a modeling transformation, a view field transformation, a projection transformation, and a viewport transformation. However, these transformations are common techniques in the CG field, and a detailed description thereof will be thus omitted.

Next, the colors for the pixels to be subjected to rendering are computed in the same way as by a common rendering unit (S208), and the frame buffer is updated (S209). In parallel with these steps of the processing, it is determined whether or not the polygon data undergoing processing belongs to the colliding object group CG data 112 (S205). As described previously, processing of the colliding object group CG data 112 is carried out here. Therefore, the rendering unit 120 notifies the collision target map production unit 130 of the positions on the frame buffer for the pixels to be subjected to rendering, which are computed in S204, and the identification information for identifying the CG data associated with the polygon undergoing processing.

The processing described above is carried out for the colliding object group CG data 112, and then carried out for the collided object group CG data 114. The processing of the collided object group CG data 114 is almost the same as that of the colliding object group CG data 112, but differs in that the collision detection table production unit 140 rather than the collision target map production unit 130 is notified of the positions on the frame buffer for the pixels to be subjected to rendering that were computed in step S204 and the identification information for identifying the CG data associated with the polygon in processing.

When the processing of the series of steps is completed in the rendering unit 120, screen data to be ultimately displayed is held in the frame buffer 152. Based on this screen data, the rendering result is displayed by a display unit 160 connected to the apparatus 100 for generating collision detection information, and presented to the user.

It is to be noted that a part of the temporary storage unit 150 constitutes the frame buffer 152, as well as a collision target map 158, a collision target LUT 156, and a collision detection table 154 to be described below. The temporary storage unit 150 is, for example, a semiconductor storage device, the address space of which is assigned depending on these various types of applications. The collision target information is composed of the collision target map 158 and the collision target LUT 156.

In the collision target map production unit 130, the collision target map 158 on which the identification information of the colliding object group CG data 112 is recorded is created on a pixel-by-pixel basis. The collision target map 158 is specifically bitmap information (bitmap data), and typically has the same pixel coordinates as those for the frame buffer 152. In other words, the collision target map 158 is created to have the same size (the same number of pixels in a matrix) as that of the frame buffer 152, thereby allowing the positions of the pixels on the frame buffer, which are provided from the rendering unit 120, to be used directly as the positions of pixels on the collision target map 158. Of course, the size of the collision target map 158 may be larger than that of the frame buffer 152. In addition, it is assumed that data on the order of several bits to ten-plus bits can be held per pixel.

The number of each pixel on the collision target map 158 is a number that identifies CG data including the pixel at the corresponding position in the frame buffer 152 as a pixel to be subjected to rendering.

For example, if the number of a pixel (a, b) on the collision target map 158 is a number that identifies CG data $\alpha$ and CG data $\beta$, the pixel (a, b) is meant to be rendered by the CG data $\alpha$ and the CG data $\beta$ as the colliding object group CG data. When it is assumed that the pixel (a, b) is also rendered by CG data $\gamma$ as the collided object group CG data, possible virtual objects which collide with the virtual object represented by the CG data $\gamma$ are limited to virtual objects represented by the CG data $\alpha$ and the CG data $\beta$, that is, it is assured that the virtual objects represented by the CG data $\gamma$ do not collide with the collision target group CG data other than the CG data $\alpha$ and the CG data $\beta$.

Figure 4:
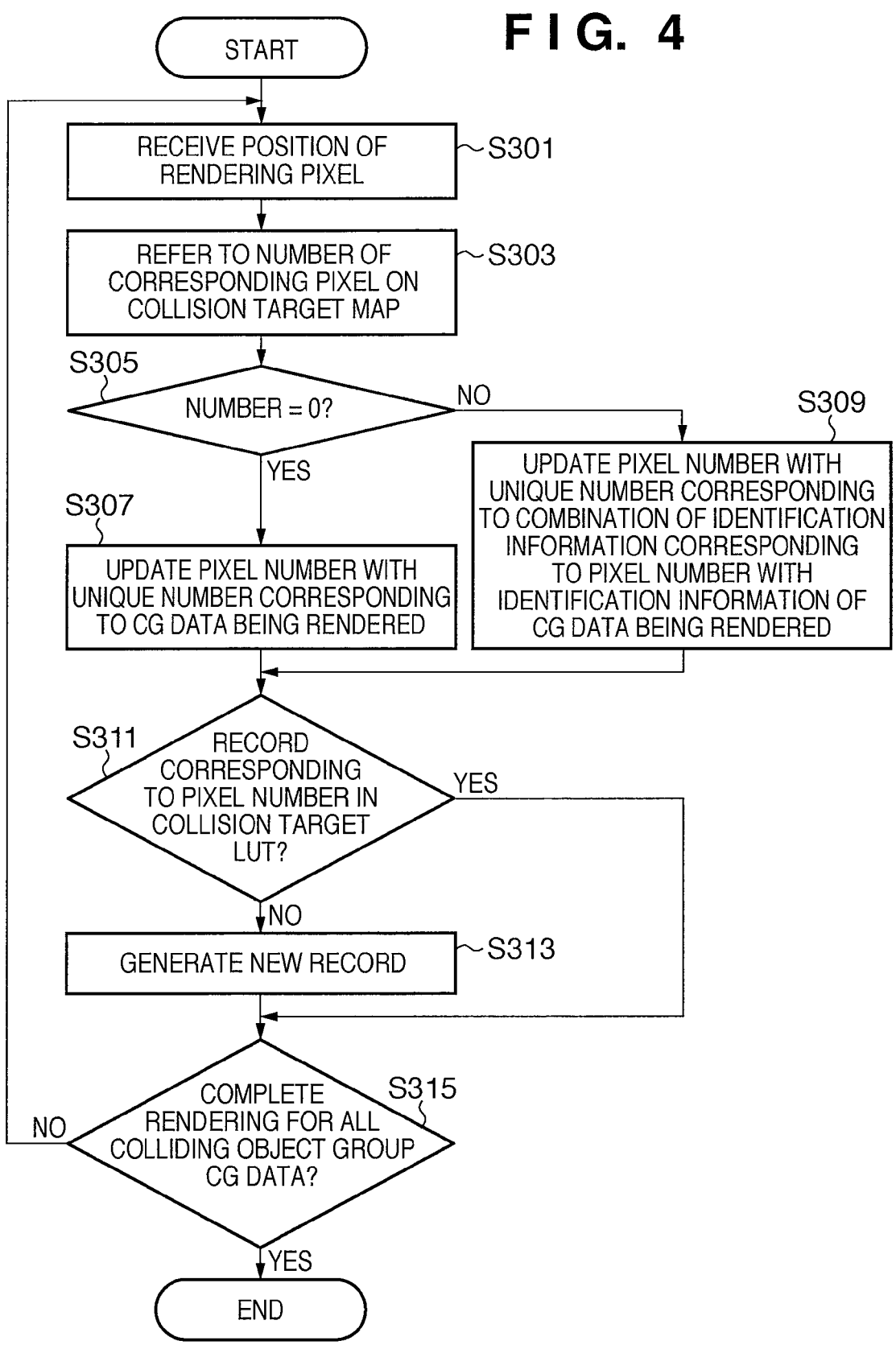
FIG. 4 is a flowchart illustrating an operation carried out by a collision target map production unit in the first embodiment of the present invention.

Operation carried out by the collision target map production unit in the first embodiment of the present invention will be described with reference to a flowchart shown in FIG. 4. It is to be noted that in the following description, CG data identified by identification information associated with a polygon will be described as polygon data representing the polygon.

As an example, it is assumed that the colliding object group CG data 112 includes only CG data representing a single cubic virtual object shown in FIG. 3. Then, a case will be considered where this cube is rendered so that a portion of this cube protrudes from a screen of 16 horizontal×12 vertical pixels (frame buffer 152).

In this case, the colliding object group CG data 112 includes 6 types of polygon data corresponding to sides (polygons) A, B, C, D, F, and F. These types of polygon data are then rendered in the order of the polygons A to F, where each polygon is to be rendered from the pixel in the vertically smallest position, or from the pixel in the horizontally smallest position in a case in which there are pixels in the same vertical position. In addition, the numbers of each pixel of the collision target map 158 are to be initialized to zero in advance. The pixel number "0" in the collision target map 158 means that the pixel has no CG data to be rendered, that is, is not included in any polygons in this embodiment.

First, the rendering unit 120 executes the processing from S202 in FIG. 2 for the polygon A, and notifies the collision target map production unit 130 of the positions of the pixels to be rendered and identification information for the polygon data while rendering the polygon A on the frame buffer.

Figure 5:
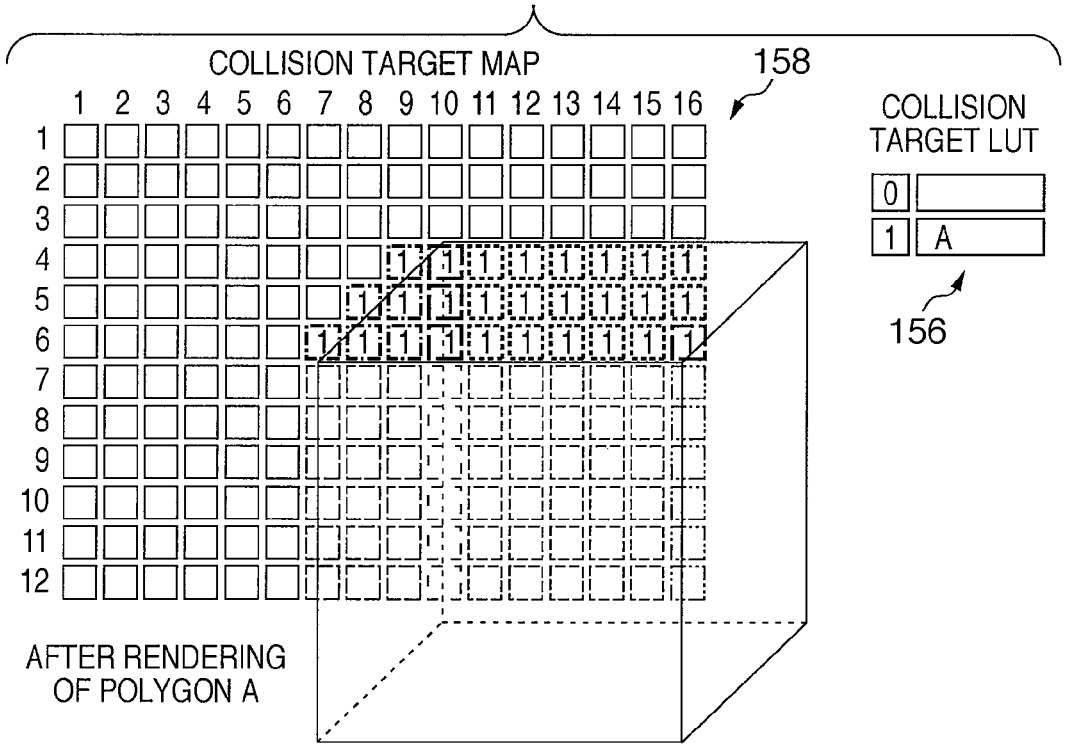
FIG. 5 is a diagram schematically illustrating each of examples of correspondences of the rendering positions of a cube representing CG data to the pixel positions in a collision target map 158, and of the pixel numbers of the collision target map 158 and the content of a collision target LUT 156 at the time of completion of rendering a polygon A, in the first embodiment of the present invention.

FIG. 5 is a diagram schematically illustrating each of examples of correspondences of the rendering positions of a cube representing CG data to the pixel positions in a collision target map 158, and of the pixel numbers of the collision target map 158 and the content of a collision target LUT 156 at the time of completion of rendering polygon A.

In the figure, each pixel of the collision target map 158 is represented by a square, and the bold squares represent pixels to be updated by rendering a polygon. In addition, the numbers in the squares represent pixel numbers, and the blank squares represent pixels with the number "0". The collision target LUT 156 is a table (table information) in which the pixel numbers of the collision target map 158 are associated with information for identifying the corresponding CG data.

During rendering of the polygon A, the collision target map production unit 130 receives the rendering positions (S301), and then refers to the numbers for pixels of the collision target map which correspond to the rendering position (S303). If the number is "0" (Y at S305), the collision target map production unit 130 updates the number with an unique number in accordance with the CG data being rendered, the number "1" in this embodiment (S307), and in addition, since the collision target LUT 156 has no record corresponding to the pixel number "1" (N at S311), adds a new record and sets the pixel number "1". Further, the collision target map production unit 130 sets, for the record of the pixel number "1", information ("A" in this embodiment) for identifying CG data (polygon data representing the polygon A undergoing processing in this embodiment), based on the provided identification information (S313).

When the rendering of the polygon A is completed, the rendering unit 120 returns the processing to S201 in FIG. 2 and the next unprocessed polygon B is rendered (S315→S301).

Figure 6:
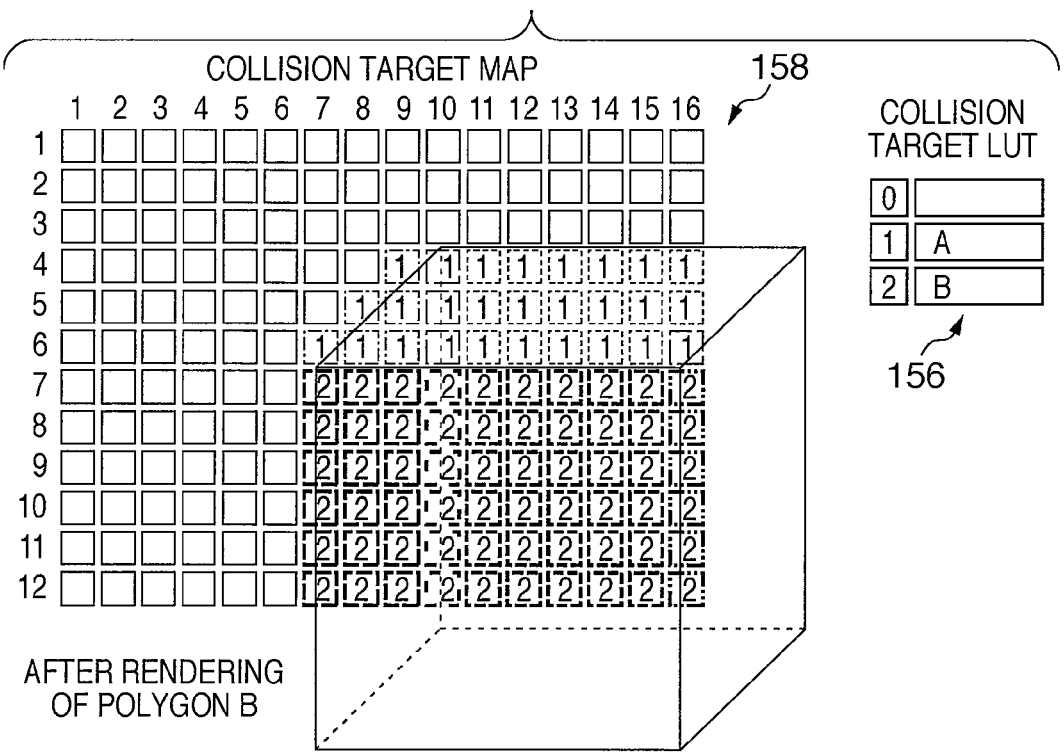
FIG. 6 is a diagram schematically illustrating each of examples of the pixel numbers of the collision target map 158 and the content of the collision target LUT 156 at the time of completion of further rendering a polygon B from the state in FIG. 5, in the first embodiment of the present invention.

FIG. 6 is a diagram schematically illustrating each of examples of the pixel numbers of the collision target map 158 and the content of the collision target LUT 156 at the time of completion of further rendering of polygon B from the state shown in FIG. 5.

As shown in the figure, the collision target map production unit 130 updates the pixels in the collision target map 158, which correspond to the pixels rendered when the polygon B is rendered, to the number "2". In addition, the collision target map production unit 130 adds to the collision target LUT 156 a record corresponding to the pixel number "2", and stores in the collision target LUT 156 information "B" for identifying polygon data representing the polygon B.

Next, the rendering unit 120 carries out rendering of the polygon C. However, it is not necessary to render the polygon C on the collision target map 158 (i.e., the frame buffer 152). Therefore, the rendering unit 120 will not notify the collision target map 158 creating unit of rendering position or identification information. Accordingly, even after the rendering of the polygon C, the collision target map 158 and the collision target LUT 156 remain unchanged.

Figure 7:
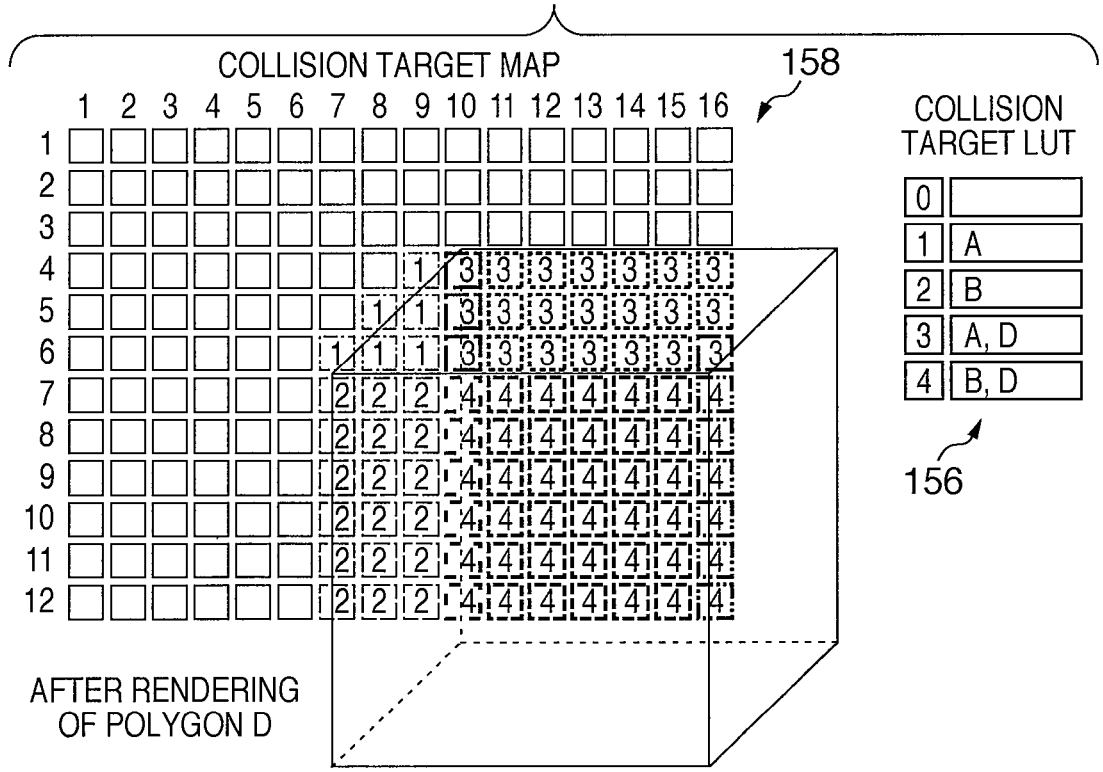
FIG. 7 is diagram schematically illustrating each of examples of the pixel numbers of the collision target map 158 and the content of the collision target LUT 156 at the time of completion of further rendering a polygon D from the state in FIG. 6, in the first embodiment of the present invention.

FIG. 7 is diagram schematically illustrating each of examples of the pixel numbers of the collision target map 158 and the content of the collision target LUT 156 at the time of completion of further rendering of polygon D from the state shown in FIG. 6.

For example, consider the pixel located horizontally tenth from the left and vertically fourth from the top, the pixel (10, 4), which is subjected to rendering in the rendering of the polygon D. The pixel (10, 4) in the collision target map 158 is subjected to rendering in the rendering of the polygon A, and thus has a number of 1. Therefore, in a case in which the rendering position (10, 4) is provided from the rendering unit 120 during the rendering of the polygon D, the collision target map production unit 130 refers to the collision target LUT 156 based on the number of the pixel (10, 4) on the collision target map, and recognizes the need for storing in the pixel (10, 4) a number for identifying polygon data of "the polygon A and the polygon D". However, there is no such combination of polygon data in the collision target LUT 156.

Therefore, the collision target map production unit 130 updates the pixel number with a number for identifying the polygon data of "the polygon A and the polygon D", with the number "3" in this embodiment (S309), and then adds to the collision target LUT 156 the record in which the information ("A, D" in this embodiment) for identifying the combination of the polygon data on the polygon A and the polygon D is associated with the corresponding new pixel number "3" (S313).

Similarly, the collision target map production unit 130 adds a record in which information "B, D" for identifying a combination of polygon data on the polygons B and D is associated with the pixel number "4" when the collision target map production unit 130 is initially notified of a pixel to be subjected to rendering with both the polygon B and the polygon D. This example corresponds to a case in which the collision target map production unit 130 is notified of the pixel (10, 7) in the collision target map 158.

As described above, the collision target map production unit 130 updates the pixels with the existing number "1" to the number "3", and the pixels with the existing number "2" to the number "4", for the numbers of the pixels in the collision target map 158 which correspond to the rendering pixel positions provided during the rendering of the polygon D.

Figure 8:
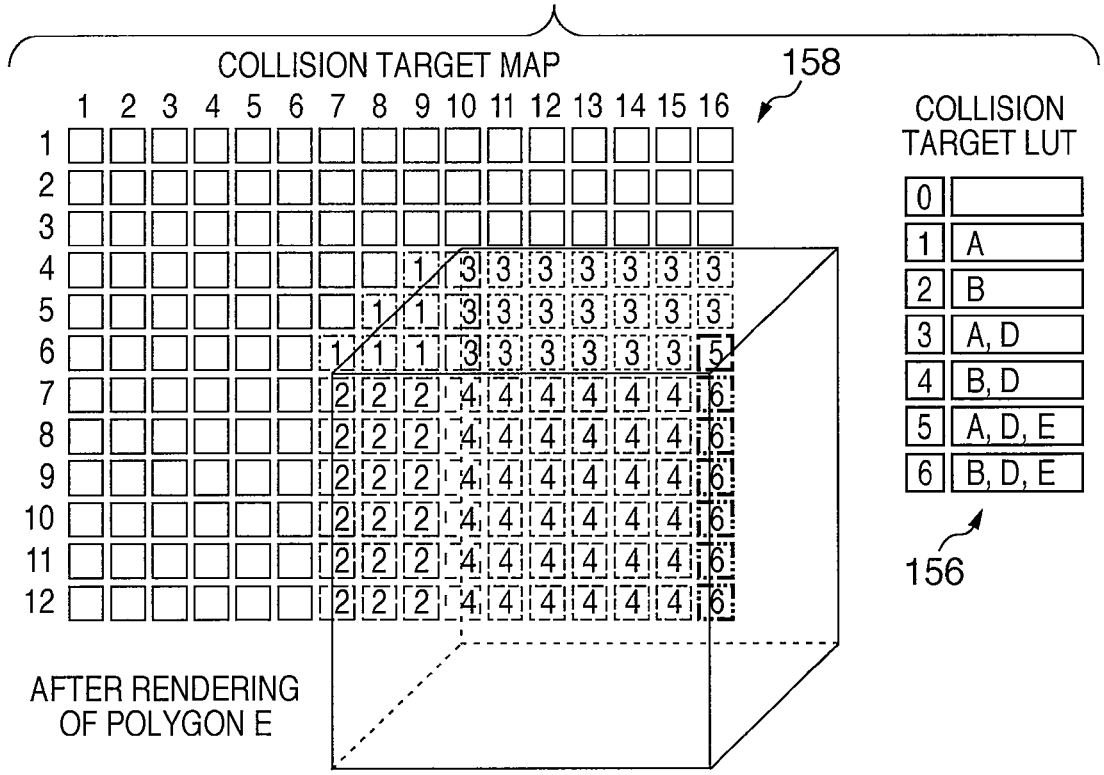
FIG. 8 is diagram schematically illustrating each of examples of the pixel numbers of the collision target map 158 and the content of the collision target LUT 156 at the time of completion of further rendering a polygon E from the state in FIG. 7, in the first embodiment of the present invention.

FIG. 8 is diagram schematically illustrating each of examples of the pixel numbers of the collision target map 158 and the content of the collision target LUT 156 at the time of completion of further rendering polygon E from the state shown in FIG. 7.

In the rendering of the polygon E, the pixel (16, 6) in the collision target map 158, which already has the number "3", is also subjected to rendering for the polygon E. Therefore, the collision target map production unit 130 adds to the collision target LUT 156 a record in which information ("A, D, E") for identifying a combination of polygon data on the polygons A, D, and E is associated with a corresponding new pixel number (5 in this embodiment) Further, the collision target map production unit 130 updates the number of the pixel (16, 6) on the collision target map 158 to the number "5".

Similarly, the collision target map production unit 130 adds, to the collision target LUT 156, a record in which information ("B, D, E") for identifying a combination of polygon data on the polygons B, D, and E is associated with a corresponding new pixel number (6 in this embodiment), and then updates the pixels (16, 7), (16, 8), . . . , (16, 12) in the collision target map 158, which are subjected to rendering for each of the polygons B, D, and E, to the number "6".

Figure 9:
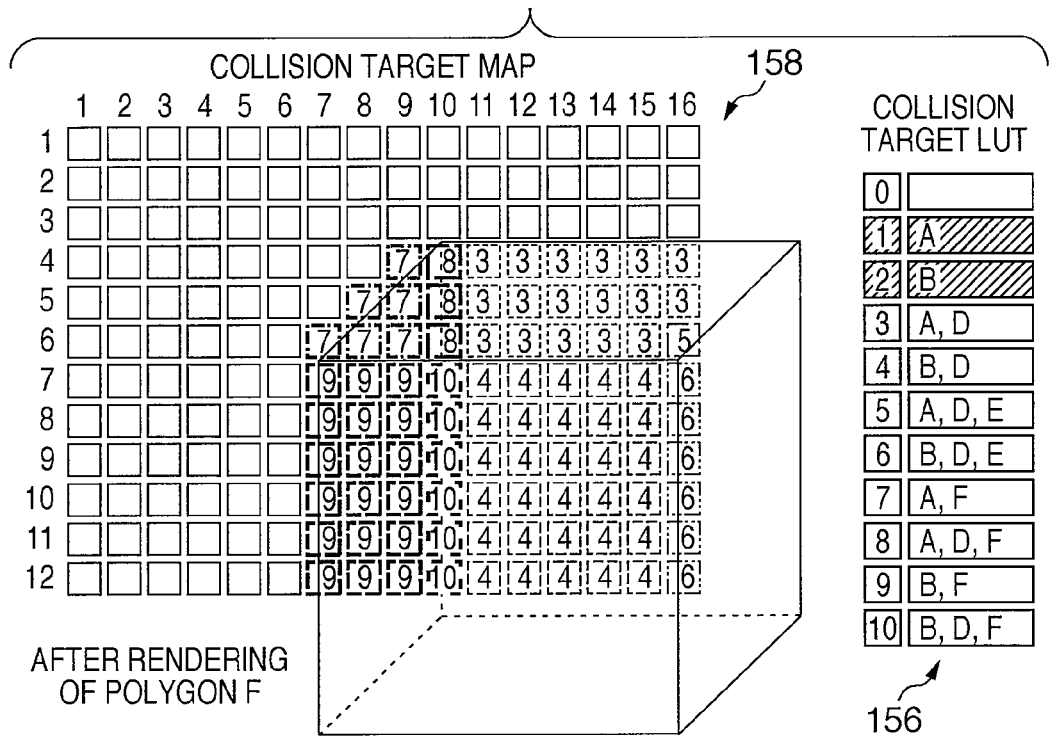
FIG. 9 is a diagram schematically illustrating each of examples of the pixel numbers of the collision target map 158 and the content of the collision target LUT 156 at the time of completion of further rendering a polygon F with the last CG data of the colliding object group CG data from the state in FIG. 8, in the first embodiment of the present invention.

FIG. 9 is a diagram schematically illustrating each of examples of the pixel numbers of the collision target map 158 and the content of the collision target LUT 156 at the time of completion of further rendering polygon F with the last CG data (polygon data) of the colliding object group CG data from the state shown in FIG. 8.

In this embodiment, the colliding object group CG data includes only the CG data representing the cube shown in FIG. 3. Thus, the collision target map 158 and the collision target LUT 156 are completed at this point. In a case in which there is other CG data in the colliding object group CG data, the collision target map production unit 130 sequentially updates pixel numbers of the collision target map 158 and adds records to the collision target LUT 156 in the same way until rendering of all of the polygons is completed. When rendering of all of the colliding object group CG data is completed (Y at S315), the collision target map production unit 130 terminates processing.

It is to be noted that, as is clear from FIG. 9, there are no pixels with the number "1" or the number "2" in the collision target map 158 at the stage of the completion of rendering the polygon F. Therefore, the records corresponding to these pixel numbers may be deleted from the collision target LUT 156.

During rendering of the collided object group CG data, the collision detection table 154 as ultimate collision detection information is generated with the use of the collision target LUT 156 and collision target map 158 as collision target information.

(Rendering of Collided Object Group CG Data)

Next, rendering of collided object group CG data and creation of a collision detection table will be described.

For the sake of simplicity, it is assumed here that the collided object group CG data includes only two sets of polygon data representing a polygon X and a polygon Y. As described in S207 of FIG. 2, the rendering unit 120 notifies the collision detection table production unit 140 of rendering positions and identification information in the rendering of the collided object group CG data.

Figure 10:
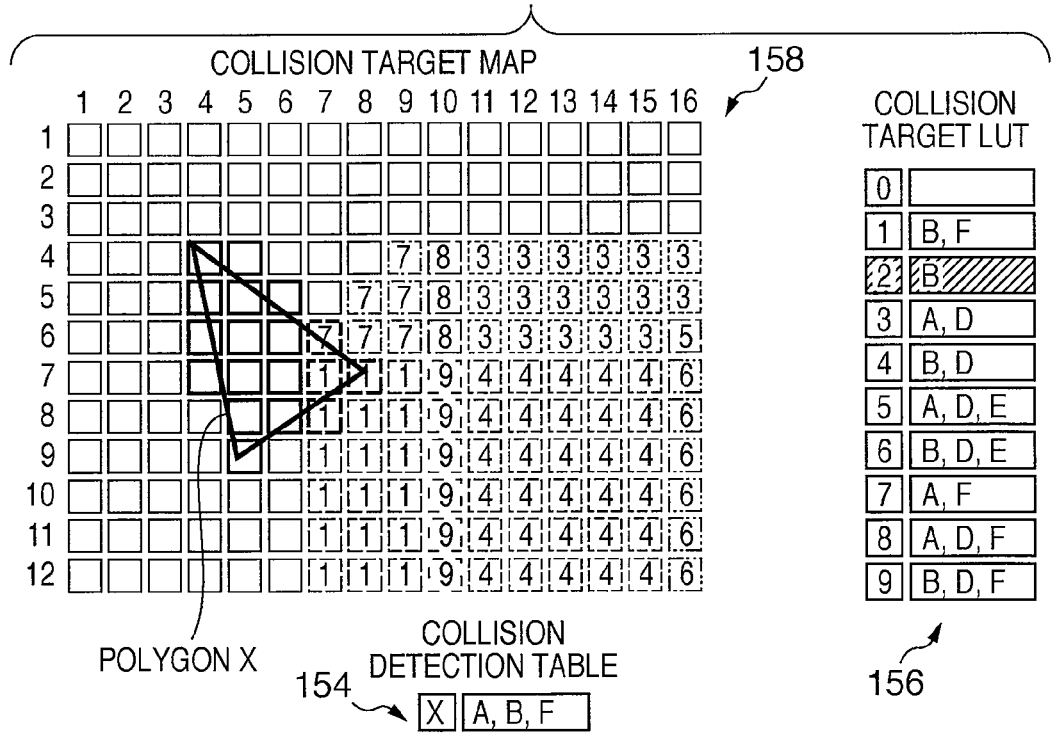
FIG. 10 is a diagram illustrating examples of the correspondence relationship between the pixels with the polygon X rendered and the pixels of the collision target map 158, of the collision target LUT, and of a collision detection table, in the state in which the collision target map 158 and the collision target LUT 156 are created.

FIG. 10 is a diagram illustrating an example of the correspondence relationship between the pixels with the polygon X rendered and the pixels of the collision target map 158 in a state in which the collision target map 158 and the collision target LUT 156 shown in FIG. 9 are created.

When rendering of the polygon X is initiated, the rendering unit 120 notifies the collision detection table production unit 140 of the positions of the pixels on which the polygon X is to be rendered. In FIG. 10, the pixels in the collision target map 158 which correspond to the positions of the pixels with the polygon X rendered are indicated by boldface.

Figure 11:
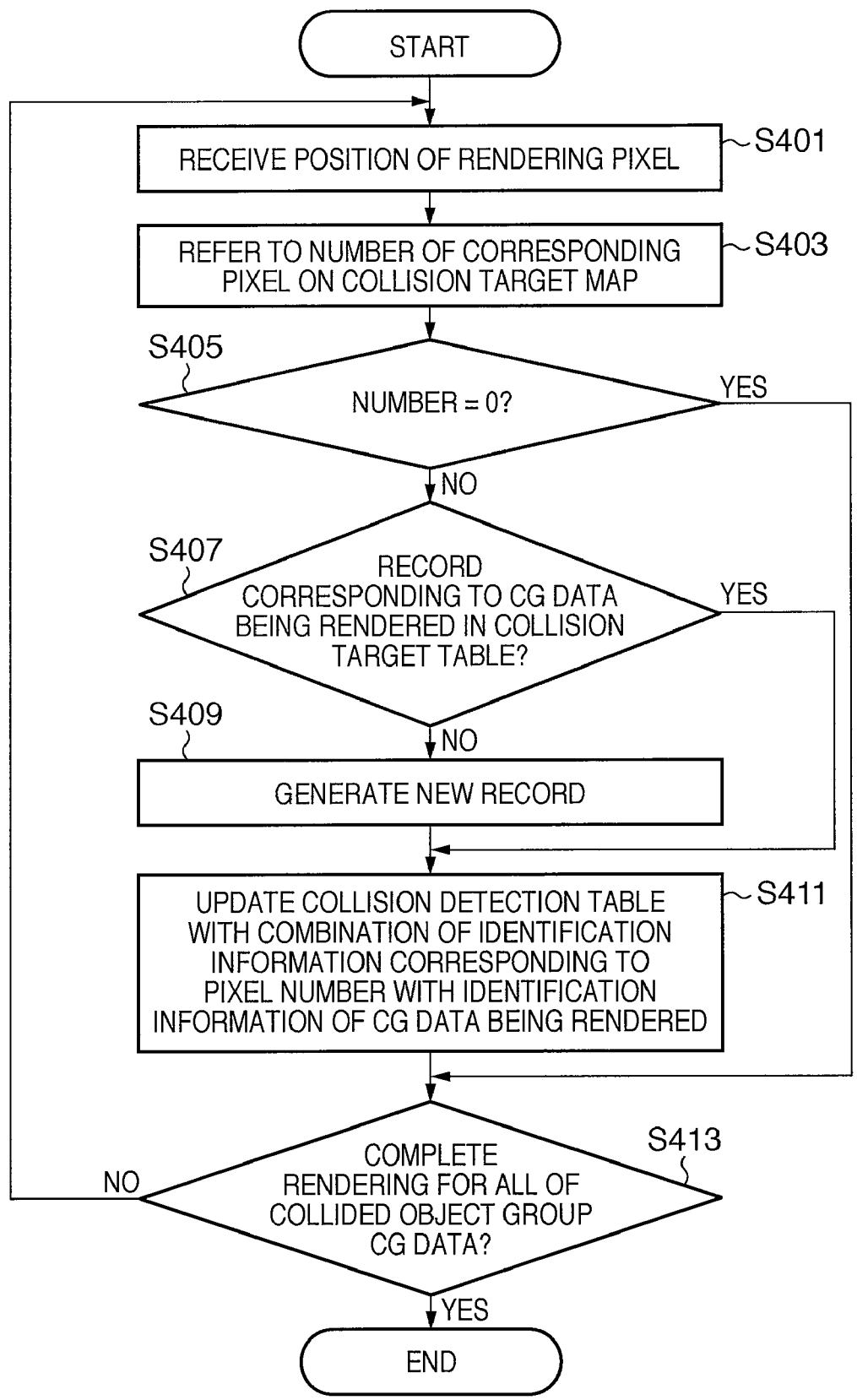
FIG. 11 is a flowchart illustrating operation carried by a collision detection table production unit in the first embodiment of the present invention.

Operation carried out by the collision detection table production unit 140 in the first embodiment of the present invention will now be described below, with reference also to a flowchart shown in FIG. 11.

When notified of the position of the first rendering pixel (4, 4) (S401), the collision detection table production unit 140 refers to the number of the corresponding pixel (4, 4) of the collision target map 158 (S403). In this case, the number is "0" (Y at S405). Then, when the collision detection table production unit 140 refers to the identification information field of the record with the pixel number "0" in the collision target LUT 156, the identification information field is blank. At this point, it is clear that this pixel for the polygon X will not collide with any of the virtual objects to be rendered by the colliding object group CG data.

Processing of the same sort is continued while carrying out rendering of the polygon X by the rendering unit 120. Then, when the collision detection table production unit 140 is notified of the position of the pixel (7, 6), the collision detection table production unit 140 refers to the number of the pixel (7, 6) of the collision target map 158. The number is "7" (N at S405), and the identification information field of the record with the pixel number "7" in the collision target LUT 156 has information "A, F". This means that the pixel (7, 6) for the polygon X in the collided object group CG data 114 could collide with the polygons A and F of the virtual object rendered by the colliding object group CG data 112.

The collision detection table production unit 140 checks if there is a record corresponding to the polygon X, which is CG data being rendered, in the collision detection table 154, which is an example of collision detection information (S407). There is no record in this embodiment.

Therefore, the collision detection table production unit 140 adds, to the collision detection table 154, a record in which information (for example, "X") for identifying the polygon X is associated with information ("A, F" in this embodiment) for identifying polygon data on the polygons A and F which could collide (S411).

When the processing is further continued until the rendering unit 120 notifies the collision detection table production unit 140 of the position of the pixel (7, 7), the collision detection table production unit 140 refers to the number "1" of the pixel (7, 7) of the collision target map 158. The identification information field of the record with the pixel number "1" in the collision target LUT 156 has information "B, F". There is already the record on the polygon X in the collision detection table 154 (Y at S407). Thus, the collision detection table production unit 140 adds information ("B, F" in this embodiment) for identifying polygon data on the polygons B, F to the information for identifying polygon data which could collide (S411). In this case, since there is already "B" in the record, the collision detection table production unit 140 adds only "F" which does not overlap. As a result, "A, B, F" is information related to the polygon X.

Figure 12:
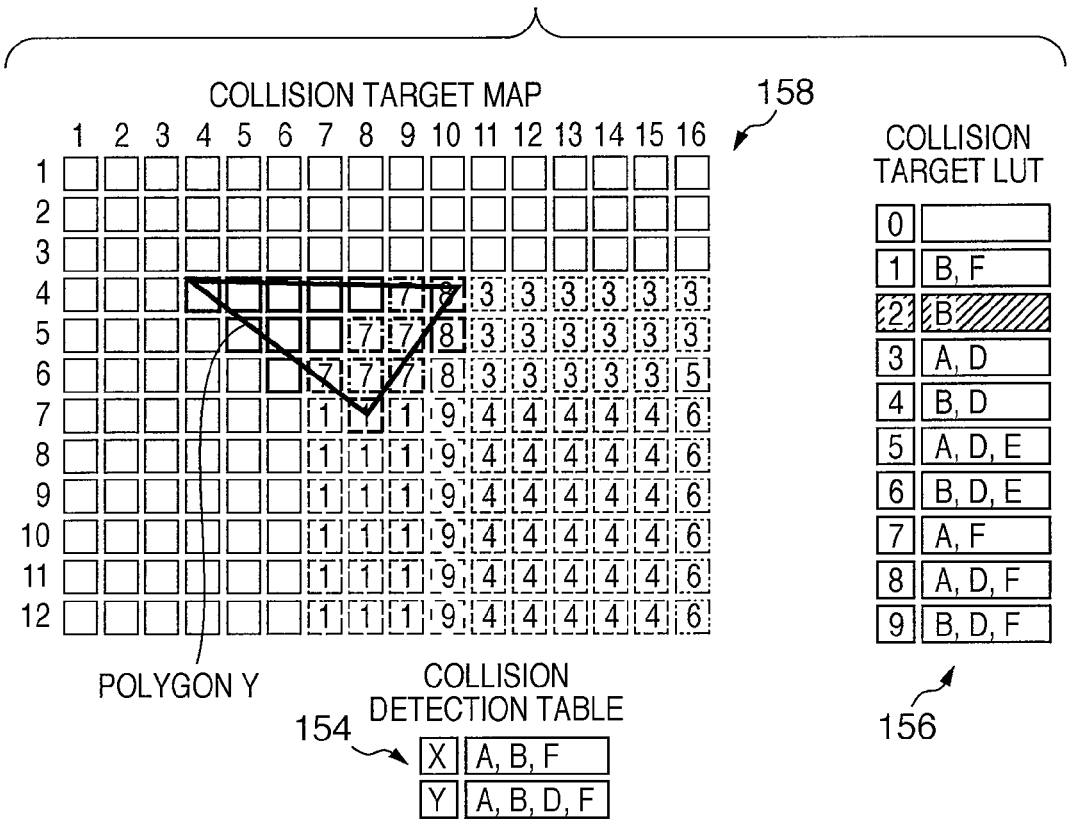
FIG. 12 is a diagram illustrating examples of the correspondence relationship between the pixels with the polygon Y rendered from the state in FIG. 10 and the pixels of the collision target map 158, of the collision target LUT, and of the collision detection table.

Processing is also carried out in the same way for the polygon Y. For the polygon Y, a record corresponding to the polygon Y is added to the collision detection table 154 during rendering for the pixel (9, 4). As shown in FIG. 12, the numbers of the pixels corresponding to the pixels with the polygon Y rendered are "0", "7", "8", and "1" in the collision target map 158. Thus, based on the information of the corresponding identification information fields, "A, F", "A, D, F", and "B, F", information "A, B, D, F" for identifying polygon data on the polygons which could collide is associated with the polygon Y at the completion of rendering the polygon Y.

In this way, the collision detection table 154 is generated for the polygon data contained in the collided object group CG data 114. When rendering of all of the collided object group CG data 114 is completed (Y at S413), the collision detection table production unit 140 terminates processing.

For example, assume that, in a VR (or MR) application, polygon data representing a virtual object with a high degree of freedom for the position and orientation (for example, a model representing a user's hand, a model of a tool held in a user's hand, or the like) is used as collided object group CG data, while polygon data representing virtual object that is manipulated, such as a component, is used as colliding object group CG data.

Then, positions and orientations of a user's hand and a tool are measured with, for example, a position and orientation sensor, and depending on the positions and orientations, a polygon is rendered with the use of collision target CG data in the colliding object group CG data to create or update a collision detection table. Then, for a combination of virtual objects identified by the completed collision detection table, ultimate collision detection can be carried out by the collision detection unit 170 applying a conventional collision detection approach. It is to be noted that the collision detection unit 170 is shown in FIG. 1 as an externally connected separate apparatus because the collision detection unit 170 is not an essential element for the present invention.

As described above, in the present embodiment, a collision target map and a collision target LUT are generated for each pixel to be subjected to rendering as collision target information with recorded identification information for CG data rendering on the pixel, while carrying out rendering of colliding object group CG data. Then, collision target information corresponding to a rendering pixel is referenced while carrying out rendering of collided object group CG data. In a case in which the colliding object group CG data is contained in the collision target information, it is determined that collision detection should be carried out for a virtual object being rendered, and collision detection information is generated.

Each of the collision target map, collision target LUT, and collision detection table according to the present embodiment can be easily obtained on a frame basis in parallel with rendering of a virtual object. Therefore, the collision target map, collision target LUT, and collision detection table can also be applied to a case in which collision detection needs to be carried out in real time for a virtual object with a high degree of freedom for the position and orientation, as in a VR (MR) application. In addition, since combinations which could collide are determined from overlaps on a pixel basis, it is possible to reduce the frequency of executing collision detection processing which does not have to be executed in actuality, and the processing time of the entire collision detection processing can thus be shortened.

Second Embodiment

In the first embodiment, unless the records corresponding to pixel numbers that are not in the collision target map 158 are deleted, records that are not used will continue to be accumulated in the collision target LUT 156.

By contrast, in the present embodiment, the size of the collision target LUT 156 is prevented from being enlarged by allowing such records to be reused.

It is to be noted that any approach may be used for adding records to the collision target LUT 156 and for computing pixel numbers after updating the collision target map 158; however, the addition and the computation can be achieved easily, for example, by adding a field for "a following pixel number" to each record of the collision target LUT 156. In addition, reuse of records in the collision target LUT 156 can be easily realized, for example, by adding a field for "the number of pixels" to each record.

These specific examples will be described referring to the rendering process described above.

Figure 13:
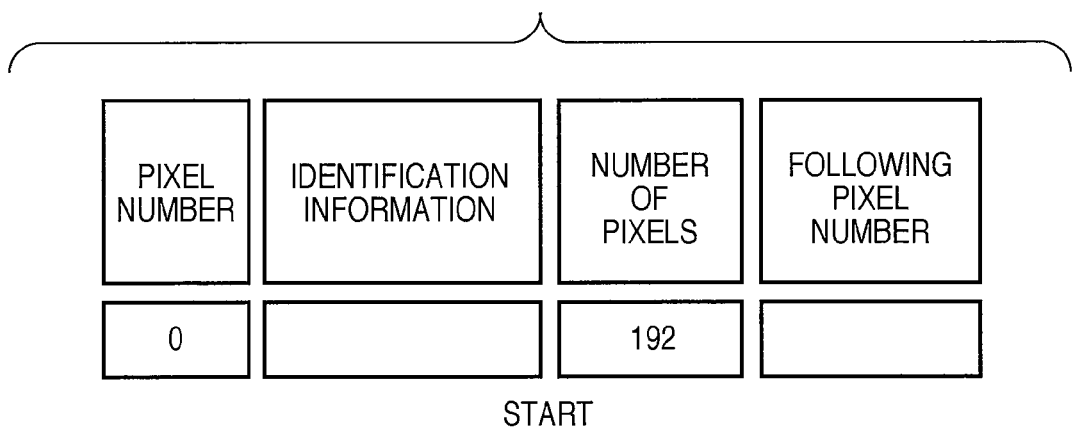
FIG. 13 is a diagram for schematically illustrating the content of the collision target LUT 156 at the start of rendering of colliding object group CG data 112 in a second embodiment of the present invention.

FIG. 13 is a diagram for schematically illustrating the content of the collision target LUT 156 at the start of rendering of the colliding object group CG data 112, where the record of the collision target LUT 156 is provided with a field for the number of pixels and a field for a following pixel number, in addition to the pixel number field and the information (identification information) field for identifying CG data corresponding to the pixel number.

The field for the number of pixels indicates how many pixels with the corresponding pixel number there are in the collision target map 158. The field for the following pixel number will be described later.

At this point, polygon rendering has not been started yet, and the rendering unit 120 has not notified the collision target map production unit 130 of the positions of pixels to be subjected to rendering. Therefore, all of the pixel numbers in the collision target map 158 remain initiated to zero, and the collision target LUT 156 thus has only a record with the pixel number "0".

At the start of rendering of the colliding object group CG data, all of the pixels have a number "0". Therefore, a value equal to the total number of pixels of the collision target map 158 (16×12=192 in this embodiment) is stored in the field for the number of pixels in the record with the pixel number "0", and the identification information field and the following pixel number field are blank (or have a value representing a blank).

It is to be noted also here that the colliding object group CG data is rendered in the order of the polygons A to F, where each polygon is to be rendered from the pixel in the vertically smallest position, or from the pixel in the horizontally smallest position in a case in which there are pixels in the same vertical position.

FIG. 14A shows the content of the collision target LUT 156 after rendering on the pixel (9, 4) (see FIG. 5) to be initially subjected to rendering in the rendering of the polygon A.

When the rendering unit 120 notifies the collision target map production unit 130 of the position of the pixel to be initially subjected to rendering of the polygon A, the collision target map production unit 130 obtains the number of the corresponding pixel (9, 4) in the collision target map 158. Then, the collision target map production unit 130 refers to the record with the pixel number "0" from the collision target LUT 156, based on the number "0" of the pixel (9, 4).

Although the collision target map production unit 130 refers to the number of the following pixel number field in the record with the pixel number "0", nothing (or the value representing a blank) is stored therein. The collision target map production unit 130, when it detects that the referenced following pixel number field is blank, creates a new record. In this case, the smallest number that is not being used in the collision target LUT 156 is set in the pixel number field of the generated record. Thus, the number 1 is set in this embodiment. Further, information "A" for identifying polygon data on the polygon A is set in the identification information field.

Then, the collision target map production unit 130 sets the value set in the pixel number field of the new record, in the blank following pixel number field which has triggered the creation of the new record.

Then, the collision target map production unit 130 again refers to the following pixel number in the record with the pixel number "0". At this point, the following pixel number of 1 is set. Further, there is also the record with the pixel number "1" corresponding to the number in the following pixel number field. Thus, the collision target map production unit 130 subtracts 1 from the number in the field for the number of pixels in the record with the pixel number "0", whereas the collision target map production unit 130 adds 1 to the number in the field for the number of pixels in the record with the pixel number "1".

Next, the rendering unit 120 notifies the collision target map production unit 130 of the pixel (10, 4). The collision target map production unit 130 refers to the following pixel number field in the record with the pixel number "0" in the collision target LUT 156, based on the number "0" of the pixel (10, 4). At this point, the number 1 is set in the following pixel number field, while there is also the record with the pixel number "1". Thus, the collision target map production unit 130 subtracts 1 from the number in the field for the number of pixels in the record with the pixel number "0", whereas the collision target map production unit 130 adds 1 to the number in the field for the number of pixels in the record with the pixel number "1".

Such operation is repeated for all of the pixels for the polygon A. The content of the collision target LUT 156 at the completion of rendering of the polygon A is shown in FIG. 14B. As shown in FIG. 5, the rendering of the polygon A updates 27 pixels in total, the pixels (9, 4) to (16, 4), the pixels (8, 5) to (16, 5), and the pixels (7, 6) to (16, 6), to the number "1". Thus, the field for the number of pixels in the record with the pixel number "1" in the collision target LUT 156 results in the number "27", whereas the field for the number of pixels in the record with the pixel number "0" results in the number of 192−27=165.

Next, similar processing is carried out for rendering the polygon B. However, prior to rendering of the polygon B, the collision target map production unit 130 clears out the following pixel number fields of all of the records of the collision target LUT 156.

FIG. 15A shows the content of the collision target LUT 156 just after rendering for the pixel (7, 7) (see FIG. 6) to be initially subjected to rendering of the polygon B.

As described above, although the collision target map production unit 130 refers to the following pixel number field in the record with the pixel number "0" based on the number "0" of pixel (7, 7), because the following pixel number field is blank the collision target map production unit 130 generates a new record. The number 2 and information "B" for identifying polygon data on the polygon B are set in the pixel number field and identification information field of this record, respectively. Then, the collision target map production unit 130 sets the number "2" in the following pixel number field in the record with pixel number "0", adds 1 to the number in the field for the number of pixels in the record with the pixel number "2", and subtracts 1 from the number in the field for the number of pixels in the record with the pixel number "0".

Such operation is repeated for all of the pixels for the polygon B. The content of the collision target LUT 156 at the completion of rendering the polygon B is shown in FIG. 15B.

When rendering of the polygon B is completed, the collision target map production unit 130 clears out the following pixel number fields of the all records of the collision target LUT 156 prior to rendering of the polygon C.

However, since the polygon C is not rendered in the image plane as described above, the collision target LUT 156 at the completion of rendering of the polygon C is equivalent to the collision target LUT 156 shown in FIG. 15B where the following pixel number field in the record with the pixel number "0" is blank.

The collision target map production unit 130 clears out the following pixel number fields of the all records of the collision target LUT 156, and reflects rendering of the polygon D in the collision target LUT 156. The rendering unit 120 notifies the collision target map production unit 130 of the pixel (10, 4) to be initially subjected to rendering in rendering of the polygon D.

The collision target map production unit 130 first obtains the number of the pixel (10, 4) of the collision target map 158. The number is 1, and the collision target map production unit 130 thus refers to the following pixel number field of the record with the pixel number "1" in the collision target LUT 156.

The following pixel number field is cleared out at this point, and thus blank. Thus, the collision target map production unit 130 newly generates a record with the pixel number "3". Then, the collision target map production unit 130 adds information "D" for identifying polygon data on the polygon D, which is identification information on the pixel undergoing processing, to the content "A" of the identification information in the record with the pixel number "1" to set information "A, D" in the identification information field.

Further, the collision target map production unit 130 sets the number 3 in the following pixel number field of the record with the pixel number "1". Then, the collision target map production unit 130 subtracts 1 from the number in the field for the number of pixels in the record with the pixel number "1" to set the number of 26, whereas the collision target map production unit 130 adds 1 to the number in the field for the number of pixels in the record with the pixel number "3" to set the number of 1. The collision target LUT 156 at this point is shown in FIG. 16A. FIG. 16B shows the collision target LUT 156 in which rendering results for all of the pixels for the polygon D are reflected in this way.

FIG. 17 shows the collision target LUT 156 in which rendering results for all of the pixels for the polygon E are reflected in a similar way.

Finally, rendering of the polygon F is carried out. FIGS. 18A and 18B show the collision target LUT 156 after rendering for the pixel (9, 4) and the collision target LUT 156 after rendering for the pixel (9, 6) in the same way as in the previous processing, respectively.

At this point, the field for the number of pixels in the record with the pixel number "1" has the number 0. Since the record in which the field for the number of pixels has the number 0 is not necessary anymore, the record is reusable for subsequently creating a new record.

When rendering of the polygon F proceeds until the collision target map production unit 130 is notified of the pixel (7, 7), the pixel (7, 7) of the collision target map 158 has the number 2, while the following pixel number field of the record with the pixel number "2" is blank.

Therefore, the collision target map production unit 130 will create a new record. However, at this point, the collision target map production unit 130 detects the value "0" of the field for the number of pixels in the record with the pixel number "1", which causes the collision target map production unit 130 to reuse the record with the pixel number "1" instead of adding a record.

More specifically, the collision target map production unit 130 sets information "B, F" for identifying polygon data on the polygons B and F in the identification information field of the record with the pixel number "1", and clears out the following pixel number field. Then, the collision target map production unit 130 sets the value "1" in the following pixel number field of the record with the pixel number "2". The collision target LUT 156 after reflecting the rendering for the pixel (7, 7) is shown in FIG. 19A.

Rendering is further continued, and the state of the collision target LUT 156 at the completion of rendering of all the pixels for the polygon F is shown in FIG. 19B.

Compared to a case without reuse, the collision target LUT 156 requires a smaller number of records when reusing the record in which the pixel number field has the number "0".

Figure 20:
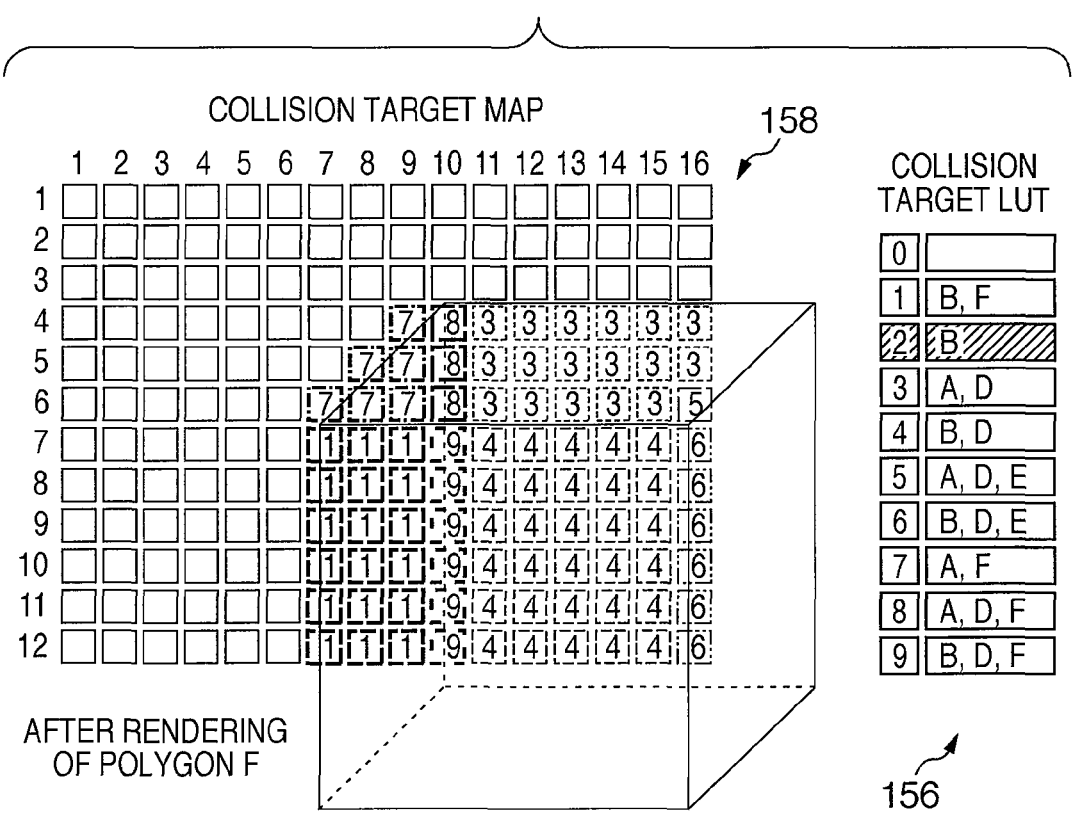
FIG. 20 is a diagram schematically illustrating each of examples of the pixel numbers of the collision target map 158 and of the content of the collision target LUT 156 at the completion of rendering the polygon F in the second embodiment of the present invention.

FIG. 20 is a diagram schematically illustrating each of examples of the pixel numbers of the collision target map 158 and of the content of the collision target LUT 156 at the completion of rendering of the polygon F, as in FIG. 9, in a case in which records are reused.

As is clear from the comparison of FIG. 9 with FIG. 20, the reuse of the record reduces the number of records of the collision target LUT 156.

The rendering of the collided object group CG data can be carried out in the same way as in the first embodiment, thereby creating a similar collision detection table.

As described above, according to the present embodiment, the advantageous effect of allowing the number of records of the collision target LUT to be prevented from being enlarged can be achieved in addition to the advantageous effect of the first embodiment.

Third Embodiment

The present embodiment carries out creation of a collision detection table more efficiently.

Specifically, the addition of a processed flag field to records of the collision target LUT 156 eliminates the process of updating identification information corresponding to the same pixel number with the same data.

FIG. 21 is a diagram illustrating a configuration example of a collision target LUT according to the present embodiment and update processing of a collision detection table in the present embodiment.

It is assumed in the embodiment that the collision target LUT 156 at the completion of rendering of the colliding object group CG data is generated in accordance with the method described in the second embodiment (that is, has the state shown in FIG. 19B).

As shown in FIG. 21, the collision target LUT 156 according to the present embodiment has at least a pixel number field, an identification information field, and a processed flag field.

The collision detection table production unit 140 first sets the processed flag fields of the all records of the collision target LUT 156 to a value representing an unprocessed state ("unprocessed" in this embodiment).

Then, when the rendering unit 120 notifies the collision detection table production unit 140 of the position of the pixel (4, 4) to be initially subjected to rendering with the polygon data on the polygon X described above, the collision detection table production unit 140 refers to the number of the pixel (4, 4) on the collision target map 158. Then, the collision detection table production unit 140 refers to the processed flag field in the record of the collision target LUT 156 which corresponds to the number "0" of the pixel (4, 4). Since the processed flag field in the record with the pixel number "0" has the value "unprocessed" representing the unprocessed state, the collision detection table production unit 140 rewrites the value to a value representing a processed state ("processed" in this embodiment).

Further, the collision detection table production unit 140 refers to the identification information field in the record with the pixel number "0". Since the identification information field is blank, processing (creation or update of a record) is not carried out on the collision detection table, which is the same as in the first embodiment.

However, when the collision detection table production unit 140 is notified of the next rendering pixel (5, 4), processing for the rendering pixel (5, 4) is terminated at that point because the processed flag field in the record with the pixel number "0" has the value "processed".

Thereafter, the corresponding pixels on the collision target map 158 have the number "0" until the rendering unit 120 notifies the collision detection table production unit 140 of the pixel (7, 6). Then, when the collision detection table production unit 140 is notified of the rendering pixel (7, 6), the corresponding pixel (7, 6) on the collision target map 158 has the number "7". Thus, the collision detection table production unit 140 refers to the processed flag field in the record with the pixel number "7" in the collision target LUT 156. Since the processed flag field has the value "unprocessed", the collision detection table production unit 140 rewrites the value to the value indicating "processed" and then refers to the identification information field in the same record. Since the identification information field has values "A, F", the process of adding a record for the polygon X to the collision detection table 154 is carried out as described in the first embodiment.

As for the following pixel (7, 7), the pixel (7, 7) on the collision target map 158 has the number of 1. Since the processed flag field in the record with the pixel number "1" in the collision target LUT 156 has the value "unprocessed", the collision detection table production unit 140 rewrites the value to the value "processed", and then refers to the identification information field in the same record. Since the identification information field has values "B, F", the process of adding the identification information to the record for the polygon X in the collision detection table 154 is carried out as described in the first embodiment. In this way, processing is carried out for all of the rendering pixels for the polygon X.

Next, similar processing is carried out for rendering of the polygon Y. However, prior to rendering of the polygon Y, the collision detection table production unit 140 sets the processed flag fields of the all records of the collision target LUT 156 to "unprocessed".

When processing is completed in this way for all of the pixels for the polygon Y, the collision detection table is obtained which is similar to that in the first embodiment.

As described above, according to the present embodiment, the collision detection table which is similar to that in the first embodiment can be created more efficiently.

Other Embodiments

It is to be noted that the collision target information is composed of a combination of the collision target map and the collision target LUT in the embodiments described above. However, the collision target information may be of any form as long as, for each pixel on the frame buffer, information for identifying a virtual object including (rendering) the pixel can be recorded. For example, in a case in which the number of bits per pixel on the collision target map is reasonably large, the identification information of the CG data may be stored directly in each pixel.

It is to be noted that the collision detection table has collections of records with the identification information of the collided object group CG data (specifically, polygon data) as keys and with the identification information groups of the colliding object group CG data (polygon data) as values in the embodiments described above. However, conversely, the collision detection table may have collections of records with the identification information of the colliding object group CG data as keys and with the identification information groups of the collided object group CG data as values.

Further, the embodiments described above describe, for all of the collided object group CG data, creating a collision detection table for one frame and then carrying out actual collision detection. This processing allows collision detection processing to be carried out all at once after the completion of rendering, and therefore relatively complex collision detection processing can be thus carried out.

However, the collision detection between polygons as exemplified in the embodiments is able to be achieved by simpler processing. With advances in GPU, rendering has been recently carried out often with a graphic board (a GPU and its peripheral circuitry). Although it is difficult to carry out complex collision computation with a graphic board, collision detection between polygons can be carried out therewith.

Therefore, for example, in a case in which collision detection between polygons is carried out with a graphic board, it is effective to carry out collision detection each time a record is generated or updated without waiting for the completion of the collision detection table.

A similar situation to the embodiments described above will be described as an example.

In this case, since collision detection is carried out for each collided object group CG data, it is not necessary for the collision detection table 154 to include the identification information of the collided object group CG data. In other words, it is sufficient for the collision detection table 154 to include only the identification information of colliding object group CG data which could collide regarding CG data being rendered, and the retrieval function with keys is not necessary.

Thus, the collision detection table production unit 140 generates the record with the polygon X as a key and "A, F" as values in the embodiments described above when notified of the pixel (7, 6), while in the present embodiment all that is needed is to set the identification information of polygon data on the polygons A and F in the collision detection table 154. Then, when the collision detection table production unit 140 is notified of the pixel (7, 7), the identification information of polygon data on the polygons B and F is additionally set. However, since the identification information on the polygon F is already set, the identification information on only the polygon B is added, and as a result, the identification information of the polygon data on the polygons A, B, and F is held in the collision detection table. When the rendering of the polygon X is completed, the collision detection unit 170 carries out collision detection with the use of the collision detection table 154.

At this point, the rendering of the polygon X is reflected in the collision detection table, and there are only three combinations of polygons to be subjected to collision detection: (X, A), (X, B), and (X, F). When the collision detection processing is completed, rendering of the polygon Y is then carried out, prior to which the content of the collision detection table 154 is deleted. Then, when processing is carried out which is similar to the processing in the rendering of the polygon X, the collision detection table 154 holds the identification information of the polygon data on the polygons A, B, D, and F. Thus, the collision detection unit 170 carries out collision detection processing for the four combinations of polygons, (Y, A), (Y, B), (Y, D), and (Y, F). The above-described processing completes collision detection between the colliding object group and the collided object group.

In addition, although the identification information of the CG data is used for identifying polygon data in the embodiments described above, the identification information may be used for identifying a virtual object. For example, in the case of an apparatus for generating collision detection information, to which the collision detection unit 170 is connected for carrying out collision detection for convexity objects, the identification information can be defined as information for identifying the convexity objects.

The embodiments described above can also be implemented as software by a system or an apparatus computer (or CPU, MPU or the like).

Therefore, a computer program supplied to a computer in order to implement the embodiments described above by such computer itself also implements the present invention. That is, a computer program for implementing the functions of the embodiments described above is itself within the scope of the present invention.

It should be noted that a computer program for implementing the embodiments described above may be in any form provided that it is computer-readable. Such a program may be executed in any form, such as an object code, a program executed by an interpreter, or script data supplied to an OS, but is not limited thereto.

Examples of storage media that can be used for supplying the program are magnetic storage media such as a floppy disk, a hard disk, or magnetic tape, optical/magneto-optical storage media such as an MO, a CD-ROM, a CD-R, a CD-RW, a DVD-ROM, a DVD-R, or a DVD-RW, and a non-volatile semiconductor memory or the like.

As for the method of supplying the program using wire/wireless communications, there is, for example, a method in which a data file (program data file), either a computer program itself that forms the invention or a file or the like that is compressed and automatically installed, and capable of becoming the computer program that comprises the invention on a client computer, is stored on a server on a computer network. The program data file may be in an executable format, or it may be in the form of source code.

Then, the program data file is supplied by downloading to a connected client computer accessing the server. In this case, the program data file may also be divided into a plurality of segment files and the segment files distributed among different servers.

In other words, a server device that provides program data files for implementing the functional processes of the present invention by computer to one or more client computers is also covered by the claims of the present invention.

It is also possible to encrypt and store the program of the present invention on a storage medium, distribute the storage medium to users, allow users who meet certain requirements to download decryption key data from a website via the Internet, and allow these users to decrypt the encrypted program by using the key data, whereby the program is installed in the user computer.

In addition, the computer program for implementing the embodiments described above may utilize the functions of an OS running on the computer.

Further, the computer program for implementing the embodiments described above may in part be constituted as firmware such as an expansion board or the like connected to the computer, or may be executed by a CPU provided on an expansion board or the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2007-154436, filed on Jun. 11, 2007, which is hereby incorporated by reference herein its entirety.

What is claimed is:

1. A method performed by a processor, for preparation of collision detection between virtual objects, comprising:
    a generation step of two-dimensionally mapping each of polygons that constitute a first virtual object to positions in a predetermined rendering region and generating collision detection target information for identifying a combination of identifications of the mapped polygons relating to each of the mapped positions in the rendering region;
    an extraction step of extracting each of positions at which at least one of polygons that constitutes a second virtual object is rendered in the rendering region; and
    a determination step of determining, from the collision detection target information, a collision detection target polygon that is included in polygons which are identified from a combination of identifications corresponding to an extracted position, extracted by the extraction step, of a polygon of the second virtual object for detecting whether the determined polygon of the first virtual object collides with the polygon of the second virtual object.

2. The method according to claim 1, wherein each of the positions in the rendering region is a pixel on an image which includes said rendering region.

3. The method according to claim 1,
    wherein the collision detection target information comprises combination records and association records,
    wherein each of the combination records indicates a combination of identifications of some polygons from among the polygons that constitute the first virtual object, and
    wherein each of the association records indicates an association between a position of the rendering region and the combination indicated by the combination records.

4. The method according to claim 3, wherein the generation step comprises:
    a search step of searching, when two-dimensionally mapping a position of each of the polygons that constitutes the first virtual object, a combination record indicating a combination of identifications of polygons corresponding to said position;

a first update step of appending, when no combination record indicating the combination of identifications of polygons corresponding to said position has been found in the search step, a combination record indicating the combination of identifications of polygons corresponding to said position, and updating the association record which includes said position using the appended combination record; and a second update step of updating, when a combination record indicating the combination of identifications of polygons corresponding to said position has been found in the search step, the association record which includes said position using the found combination record.

5. The method according to claim 4, wherein the generation step further comprises:

a deletion step of deleting a combination record indicating a combination of identifications of polygons which does not correspond to any position in the association records.

6. The method according to claim 4, wherein the generation step generates the collision detection target information by two-dimensionally mapping the position of each the polygons that constitute the first virtual object in a predetermined order of said polygons;

wherein each of the combination records has an identification tracing field identifying another combination record, which is included in an association record whose association has changed from an association between a position and said each of combination records to an association between said position and said another combination record; and wherein the search step searches, when two-dimensionally mapping a position of each of polygons that constitute the first virtual object, a combination record which is identified by the identification tracing field in a combination record which has a combination corresponding to said position.

7. The method according to claim 6, wherein the search step determines that no combination record indicating the combination of identifications of polygons corresponding to said position, if no combination record identified by the identification tracing field of the combination record has the combination corresponding to said position.

8. The method according to claim 7, wherein the generation step clears a value of the identification tracing field of each of the combination records whenever a new polygon is to be two-dimensionally mapped.

9. The method according to claim 4, wherein each of the combination records has a position count field which indicates count of positions, wherein each of said positions corresponds to a combination of the said each of combination records; and wherein the first update step of editing data of a combination of a combination record which has zero count in the position count field of which, instead of appending new combination record.

10. The method according to claim 1, wherein in the generation step, a combination of (1) an identification of a newly-mapped polygon and (2) a combination of identification(s) of already-mapped polygon(s) is associated with each of the mapped positions.

11. A non-transitory computer-readable storage medium that stores a program for executing a method for preparation of collision detection between virtual objects, the method for preparation of collision detection between virtual objects comprising:

a generation step of two-dimensionally mapping each of polygons that constitute a first virtual object to positions in a predetermined rendering region and generating collision detection target information for identifying a combination of identifications of the mapped polygons relating to each of the mapped positions in the rendering region;

an extraction step of extracting each of positions at which at least one of polygons that constitute a second virtual object is rendered in the rendering region; and a determination step of determining, from the collision detection target information, a collision detection target polygon that is included in polygons which are identified from a combination of identifications corresponding to an extracted position, extracted by the extraction step, of a polygon of the second virtual object for detecting whether the determined polygon of the first virtual object collides with the polygon of the second virtual object.

12. An apparatus for preparation of collision detection between virtual objects, comprising:

a generation unit which two-dimensionally maps each of polygons that constitute a first virtual object to positions in a rendering region specified in advance and generates collision detection target information for identifying a combination of identifications of the mapped polygons relating to the each of the mapped positions in the rendering region;

an extraction unit which extracts each of positions at which at least one of polygons that constitute a second virtual object is rendered in the rendering region;

a determination unit which determines, from the collision detection target information, a collision detection target polygon that is included in polygons which are identified from a combination of identifications corresponding to an extracted position, extracted by the extraction unit, of a polygon of the second virtual object for detecting whether the determined polygon of the first virtual object collides with the polygon of the second virtual object; and a processor which controls the generation unit, the extraction unit, and the determination unit.

* * * * *